United States Patent
Augusto et al.

(10) Patent No.: US 6,943,051 B2
(45) Date of Patent: Sep. 13, 2005

(54) METHOD OF FABRICATING HETEROJUNCTION PHOTODIODES INTEGRATED WITH CMOS

(75) Inventors: Carlos J. R. P. Augusto, San Jose, CA (US); Lynn Forester, San Jose, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 82 days.

(21) Appl. No.: 10/399,495

(22) PCT Filed: Oct. 12, 2001

(86) PCT No.: PCT/EP01/11817

§ 371 (c)(1),
(2), (4) Date: Apr. 17, 2003

(87) PCT Pub. No.: WO02/33755

PCT Pub. Date: Apr. 25, 2002

(65) Prior Publication Data

US 2004/0097021 A1 May 20, 2004

Related U.S. Application Data

(60) Provisional application No. 60/241,551, filed on Oct. 19, 2000.

(51) Int. Cl.⁷ .............................................. H01L 21/00
(52) U.S. Cl. .......................................... 438/58; 438/30
(58) Field of Search ............................. 438/58, 48, 57, 438/30, 154

(56) References Cited

U.S. PATENT DOCUMENTS

| | | | |
|---|---|---|---|
| 4,887,142 A | * | 12/1989 | Bertotti et al. .............. 257/338 |
| 5,557,121 A | | 9/1996 | Kozuka et al. |
| 5,686,734 A | | 11/1997 | Sugawa et al. |
| 5,985,689 A | | 11/1999 | Kozuka et al. |
| 6,058,229 A | | 5/2000 | Burrows et al. |
| 6,091,127 A | | 7/2000 | Weirauch et al. |

OTHER PUBLICATIONS

Vonsovici et al., "Room Temperature Photocurrent Spectroscopy of SIGE/SI P–I–N Photodiodes Grown By Selective Epitaxy", IEEE Transactions on Electron Devices, vol. 45, No. 2, Feb. 1, 1998.

* cited by examiner

*Primary Examiner*—Long Pham
*Assistant Examiner*—(Vicki) Hoa B. Trinh
(74) *Attorney, Agent, or Firm*—Sturm & Fix LLP

(57) ABSTRACT

A method in which thin-film p-i-n heterojunction photodiodes are formed by selective epitaxial growth/deposition on pre-designated active-area regions of standard CMOS devices. The thin-film p-i-n photodiodes are formed on active areas (for example $n^+$-doped), and these are contacted at the bottom (substrate) side by the "well contact" corresponding to that particular active area. There is no actual potential well since that particular active area has only one type of doping. The top of each photodiode has a separate contact formed thereon. The selective epitaxial growth of the p-i-n photodiodes is modular, in the sense that there is no need to change any of the steps developed for the "pure" CMOS process flow. Since the active region is epitaxially deposited, there is the possibility of forming sharp doping profiles and band-gap engineering during the epitaxial process, thereby optimizing several device parameters for higher performance. This new type of light sensor architecture, monolithically integrated with CMOS, decouples the photo-absorption active region from the MOSFETs, hence the bias applied to the photodiode can be independent from the bias between the source, drain, gate and substrate (well) of the MOSFETs.

12 Claims, 26 Drawing Sheets

Figure 1 : Prior Art

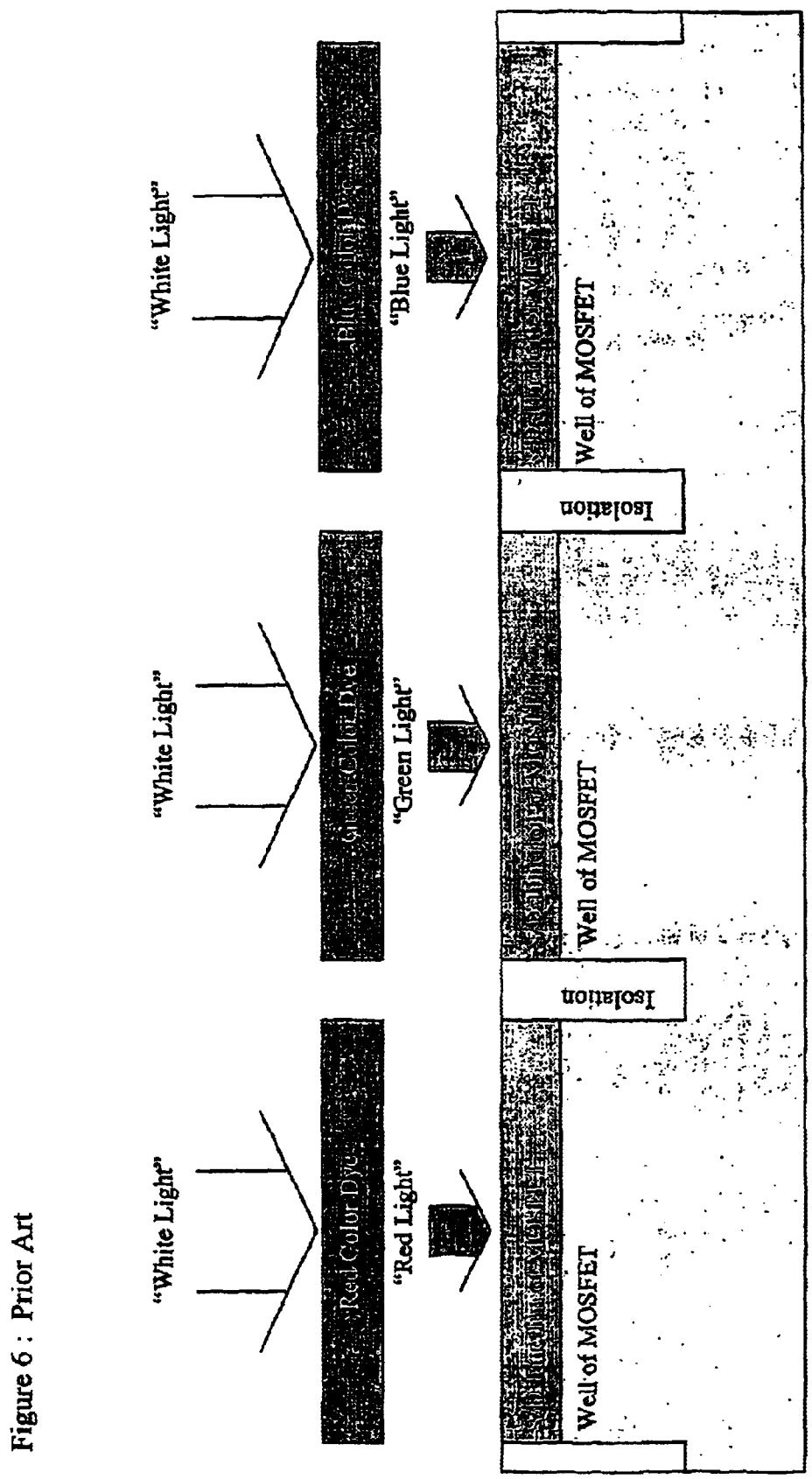
Figure 6 : Prior Art

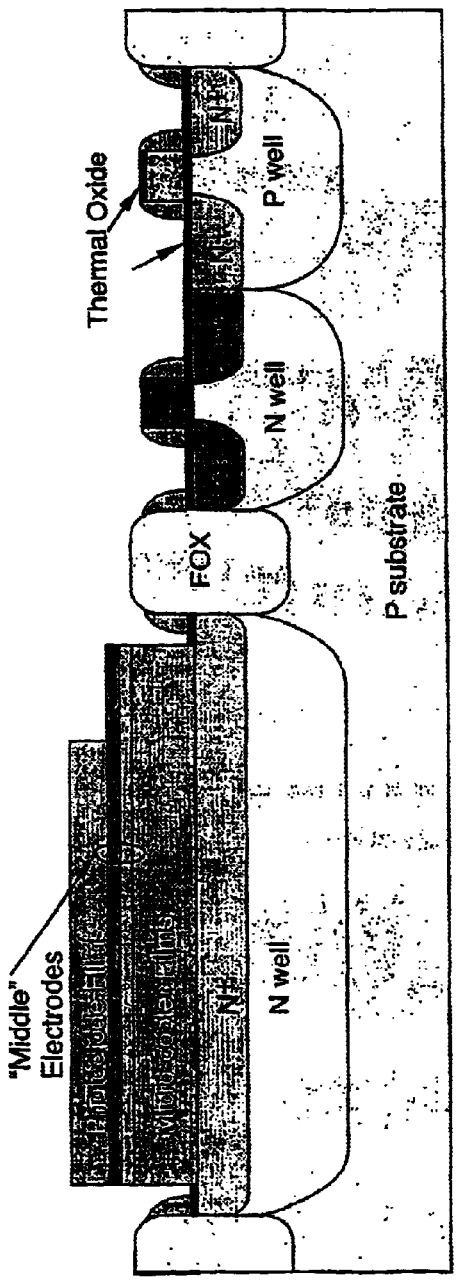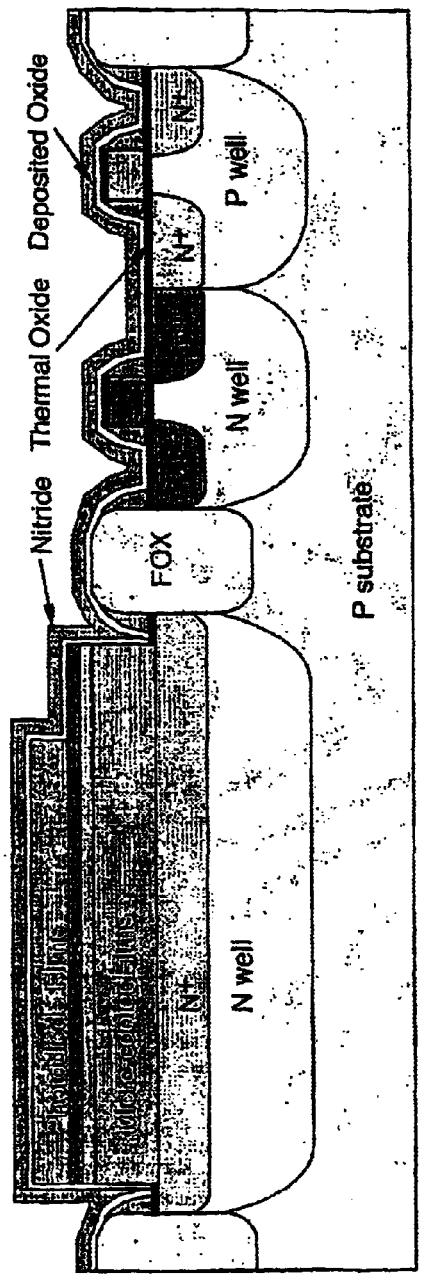
Figure 11g
Figure 11h

METHOD OF FABRICATING HETEROJUNCTION PHOTODIODES INTEGRATED WITH CMOS

BACKGROUND OF THE INVENTION

The present invention relates to the fabrication of light-sensing devices based on, and integrated with, silicon Complementary Metal Oxide Semiconductor (CMOS) circuits.

There are two main light-sensor architectures in silicon technology: Charge Coupled Devices (CCDs), whose operation is based on MOS diodes, and CMOS image sensors whose operation is based on pn-junctions. The principles of operation of these devices can be found in "Physics of Semiconductor Devices" by S. M. Sze, Wiley, New York, 1981, Chapters 7 and 13.

For both device types the absorption efficiency as a function of wavelength is entirely dependent on the opto-electronic properties of bulk silicon. For that reason, both device types have significantly different responses for wavelengths at the extremes of the visible spectrum (violet/blue versus red). Also for that reason both devices have very low efficiency of near Infra-Red (IR) detection, and are incapable of detection of the 1.3 $\mu$m and 1.55 $\mu$m wavelengths, which are used for fiber optics communications. Yet again for that same reason both devices cannot provide "solar blind" Ultra-Violet (UV) detection. By "solar blind" it is meant that the wavelengths longer than the UV (visible and IR ranges) are not detected, i.e., the photons of those wavelengths are not absorbed.

For the visible range, CMOS image sensors have been gaining ground on CCDs on the basis of their greater degree of compatibility with the standard CMOS processing used for Microprocessors, DRAMs, DSPs, etc, and hence the possibilities for System on Chip (SoC), of which the image-sensor would be a key component. The straightforward integration with CMOS circuitry (logic and memory) allows higher functionality and lower cost. A cross-sectional view of a conventional CMOS imager is shown in FIG. 1. CMOS Imagers are thus fast becoming the image sensors of choice for many products such as digital cameras & camcorders, PC cameras, imagers for third generation (3G) cell phones, etc. CMOS imagers also offer advantages in terms of circuit design, given the possibility of random access to each pixel, the inclusion in individual pixels of circuitry which can speed up signal amplification and processing, leading to overall improved quality of image.

Another perceived advantage of CMOS imagers, from a process technology standpoint, is that pixel scaling could just follow the fast pace of scaling CMOS transistors, thus benefiting from enormous economies of scale with respect to technology development. However, it is becoming evident that for advanced CMOS technologies (e.g. below 0.25 $\mu$m) there are fundamental issues that prevent a modular straightforward integration of image sensors with standard CMOS logic.

At the present time, all evidence leads to the conclusion that the problems of integrating light sensors with standard CMOS becomes worse as the critical dimensions become smaller (more advanced CMOS technology). This is especially true for the detection/absorption of photons with the longer wavelengths of the visible spectrum (red color: $\lambda \approx 650$ nm).

The scaling of CMOS imagers faces two types of issues: semiconductor physics and technological problems.

The semiconductor physics problem is related to the thickness (depth) of silicon necessary to absorb enough light in order to produce a useful electrical signal. This is determined by the band-structure of the active-layer of the photodiode.

On the other hand, it is also a technological issue because the depth of trench isolation between CMOS devices, and the source/drain junctions become shallower with each new, more advanced, CMOS generation. When the depth of the isolation trenches becomes less than the distance required to absorb photons of a particular wavelength, then it is no longer possible to separate the charge carriers generated by light penetrating silicon at adjacent pixels. Consequently, there is a loss of resolution for the detection of that color.

Similarly, when electron-hole pairs are generated far away from the increasingly shallower metallurgical junction between source/drain and substrate/well, the electric field is very weak, thus the charge carriers travel by diffusion very slowly towards the electrodes. This increases the probability of recombination occurring before reaching the electrodes, thereby reducing the photocurrent, which impacts parameters such as signal-to-noise ratio and speed of image acquisition.

Therefore, there are two contradictory requirements: on one hand there is a fixed parameter, the coefficient of absorption, in silicon for the absorption of light, which is different for each primary color/wavelength, and on the other hand, the advancement of CMOS technology requires devices with shallower junctions and shallower trenches between adjacent MOSFETs.

Thus far, the workarounds used to solve these problems, have consisted in tuning the standard CMOS process flow, for a given technology generation, and introduce process steps specific to the devices related to the light-absorbing areas. These extra steps provide the necessary trench depth and junction depth/profiles for the light sensor devices. However, these extra process steps do not address the photodiode device architecture and/or materials, which remains unchanged.

It must be highlighted that some of these special steps are performed quite early in the CMOS process flow, and because of that, there is an impact on other subsequent process steps/modules, thus requiring the modification/fine-tuning of the latter.

For example, shallow trench isolation (STI), which is the standard isolation technology for 0.25 $\mu$m CMOS and below, is one of the first process modules in the long list of steps to fabricate CMOS devices.

Other steps requiring modification for the light sensor devices are the potential well and the junction doping profiles, thus changing ion-implantation steps and thermal annealing/activation steps. With these modifications the fabrication of image sensors is no longer modular and requires extended adjustments for every new CMOS generation. The extension of the adjustments becomes more severe with increasingly smaller critical dimensions of inherent to advancement of CMOS technology.

At the moment, optoelectronic transceivers for fiber optics communications, consisting of a light sensing device (photodiode) and trans-impedance amplifiers, are made with different III/V compound materials, and are not made monolithically integrated. The photodiode is made with a material sensitive to the wavelength of interest, for instance 1.3 $\mu$m or 1.55 $\mu$m or other wavelengths, and the trans-impedance amplifiers are made with wider band-gap materials for high-speed electronics.

Alternative device architectures for light sensing do exist, but fail to fulfill all the necessary requirements for manufacturable high quality photo-detection in the visible or invisible range, or have not been able to compete with standard straightforward CCDs and CMOS imagers.

One of the most interesting alternative device architectures is the Avalanche Photo-Diode (APD), which in spite of being known for decades, only very recently started to gain attention as a possible light sensor to be integrated into BiCMOS processes (Alice Biber, Peter Seitz, Heinz Jäckel, "Avalanche photodiode image sensor in standard silicon BiCMOS technology", Sensors and Actuators A 90 (2001) pp. 82–88). However, for reasons related to the quality of the active-layer material (ion-implanted bulk silicon), and for other reasons related to the device architecture (bulk lateral pn-photodiode) this kind of APD has not, and is not likely, to succeed in competing against CCDs and CMOS imagers.

Avalanche mode is not a viable option with conventional CMOS light sensors because the avalanche mode requires the depletion region of the pn-junction to be under an electric field near the breakdown field of the junction, which for silicon is close to 500 kV/cm. For a depletion region about 200 nm wide (deep) for example, that would require about 10 volts. Such large voltage could break the gate oxide of the MOSFETs in whose junction the photo-absorption takes place. It would also prevent the seamless integration at the electrical level, with the CMOS logic outside the pixel.

Larger coefficients of absorption for the visible range, infra-red, including 1.3 μm and 1.55 μm wavelengths as well as other wavelengths of interest, can be achieved through the incorporation of materials with band-gaps different than that of silicon (see for example S. M. Sze, "Physics of Semiconductor Devices", Wiley, New York 1981, FIG. 5, p. 750, and FIG. 6, p. 751).

There are many examples of materials, which may be either grown or deposited by Chemical Vapor Deposition (CVD) or Physical Vapor Deposition (PVD) on silicon.

Examples include $Si_{1-x}Ge_x$, $Si_{1-y}C_y$, $Si_{1-x-y}Ge_xC_y$, PbTe, ZnS, GaN, AlN, $Al_2O_3$, $Pr_2O_3$, $CeO_2$, $CaF_2$, $Sr_2TiO_4$, etc.

As an example of work to date, the integration of crystalline $Si_{1-x}Ge_x$, and/or $Si_{1-x-y}Ge_xC_y$ p-i-n photodiodes has only been possible with Heterojunction Bipolar Transistors but not with standard CMOS [3] ("Monolithically Integrated SiGe—Si PIN-HBT Front-end Photoreceivers", J. Rieh et al, IEEE Photon. Tech. Lett., Vol. 10, 1998, pp. 415–417).

OBJECT OF THE INVENTION

One object of this invention is to provide a new method for fabricating light sensing devices for visible and invisible wavelengths, integrated with CMOS circuitry, including CMOS generations from 0.25 μm to below 0.1 μm gate lengths.

Another object of the invention is to provide a new method that enables more advanced photo-sensing device architectures and materials, including but not limited to random alloys, and/or quantum wells, and/or superlattices, of $Si_{1-x}Ge_x$, $Si_{1-y}C_y$, $Si_{1-x-y}Ge_xC_y$, PbTe, ZnS, GaN, AlN, $Al_2O_3$, $LaAlO_3$, $Pr_2O_3$, $CeO_2$, $CaF_2$, $Sr_2TiO_4$, etc., and which are suitable for the fabrication of very large two-dimensional arrays of light sensing devices.

A further object of the present invention is to provide an advanced device architecture for light sensing that fulfills all the necessary requirements for high-quality image sensing in the visible range, capable of competing with CCDs and conventional CMOS imagers, and that is suitable for integration with CMOS technology from 0.25 μm to below 0.1 μm gate length generations.

Yet another object of the invention is to provide a method of fabricating light sensing devices integrated with CMOS circuitry, that are ideally suited for operation in avalanche mode, with many advantages and none of the drawbacks of the conventional APDs.

Yet another object of the invention is to provide a new method of fabricating Infra-Red (IR) imaging capability integrated with CMOS circuitry, and which is suitable for the fabrication of very large two-dimensional arrays of IR sensing devices.

Yet another object of the invention is to provide a new fabrication method that enables the option of very large two-dimensional arrays of Infra-Red (IR) imaging side-by-side with R, G, B imaging, at a very small penalty (~8%) in terms of area for each of the R, G, B sensors.

Yet another object of the invention is to provide a new method of fabricating Ultra-Violet (UV) imaging capability integrated with CMOS circuitry, and which is suitable for the fabrication of very large two-dimensional arrays of UV sensing devices.

Yet another object of the invention is to provide a new fabrication method that enables the option of very large two-dimensional arrays of Ultra-Violet (UV) imaging side-by-side with R, G, B imaging, at a very small penalty (~8%) in terms of area for each of the R, G, B sensors.

Yet another object of the invention is to provide a new method of fabricating Ultra-Violet (UV) and Infra-Red (IR) imaging capabilities integrated with CMOS circuitry, and which is suitable for the fabrication of very large two-dimensional arrays of UV and IR sensing devices.

Yet another object of the invention is to provide a new method of fabricating Ultra-Violet (UV), Infra-Red (IR), and RGB imaging capabilities integrated with CMOS circuitry, and which is suitable for the fabrication of very large two-dimensional arrays of UV, IR, and RGB sensing devices.

A further object of the invention is to provide a new fabrication method that enables the photo-detection of the 1.3 μm and 1.55 μm wavelength ranges, fully integrated with advanced CMOS devices for trans-impedance amplifiers, digital logic, memory, etc.

Yet another object of this invention is to provide a new fabrication method that allows and enables the monolithic integration of micro-cooling devices with the photo-sensing films.

SUMMARY OF THE INVENTION

In accordance with the present invention, one exemplary method of implementation is to form thin-film p-i-n hetero-junction photodiodes by selective epitaxial growth/deposition on pre-designated active-area regions of standard CMOS devices. Non-selective epitaxial growth/deposition is also possible, but requires extra process steps to remove the non-epitaxial material formed outside the "windows" over the silicon surface.

In order to spare the photo-sensitive films from high temperature processing, the formation of these films can be done either just before or after the last step of Front-End Of Line (FEOL), which is the formation of a metal silicide layer on the source, drain and gate poly-Si lines; prior to metallization (interconnects). The absence of high temperature steps after the formation of the photo-sensitive films enables those films to be made with a wider choice of materials, including highly strained hetero-structures.

The metal silicide minimizes the contact and series resistance of poly-Si lines and of selected areas of source/drain junctions not used for light sensing. Silicides also prevent spiking of the source/drain junctions by the metal(s) used for interconnects. As for conventional CMOS imagers based on 0.25 µm technology and below (Shou-Gwo Wuu et al, "High Performance 0.25 µm CMOS Color Imager Technology with Non-silicide Source/Drain Pixel", Int. Electron Device Meeting, Tech. Digest, 2000), special care is required with the formation of metal silicide.

The thin-film p-i-n photodiodes are formed on active-areas (for example $n^+$-doped), and these are contacted at the bottom (substrate) side by the "well contact" corresponding to that particular active-area. There is no actual potential well, since that particular active-area has only one type of doping. The top of each photodiode has a separate contact formed thereon.

The top contact can cover the entire photodiode film, if made with a material transparent to the wavelengths of interest. For the visible range and IR, Indium Tin Oxide (ITO) is an example of such material (this option is not described in the figures). The conventional contact materials to silicon materials and devices, such as metal silicides, are opaque to wavelengths from the IR to the visible to the UV. Therefore, top contacts made with silicides must cover only a minimal area of the surface of the photodiode film just enough for the fabrication of interconnects.

The selective epitaxial growth of the p-i-n photodiodes is modular, in the sense that there is no need to change any of the steps developed for the "pure" CMOS process flow. It is anticipated that there will be no impact of the thermal budget associated with the epitaxial deposition process itself. The typical surface conditioning before epitaxy (pre-epi bake) involves a high temperature annealing of the wafer surface. However, advanced surface preparation techniques indicate that it is possible to achieve a significant reduction of the temperature required for this pre-epitaxy surface conditioning. When this temperature is reduced below the point of dopant diffusion, there ceases to exist any impact on the pre-made CMOS devices.

A p-i-n photodiode, whose active region is an epitaxially deposited thin-film, results in a better crystalline film quality, than if the active layer were a bulk region having suffered several ion-implantation steps. The benefits of superior crystalline perfection include: longer carrier lifetimes, i.e. reduced recombination rates, higher mobility, reduced electronic noise, etc. Thin-film devices enable very strong electric fields with low voltages. Also, as all photons are absorbed in a thin-film, there is a high efficiency and high speed of carrier collection, no cross talk between adjacent pixels, etc.

Since the active region is epitaxially deposited, there is the possibility of forming sharp doping profiles and band-gap engineering during the epitaxial process, thereby optimizing several device parameters for higher performance. This new type of light sensor architecture, monolithically integrated with CMOS, decouples the photo-absorption active region from the MOSFETs, hence the bias applied to the photodiode can be independent from the bias between the source, drain, gate and substrate (well) of the MOSFETs.

In conclusion, the light sensor of the present invention can be used with the most advanced CMOS technology available, with minimal process development work.

The vertical photodiode structure according to this invention is suitable for operation in Avalanche and Geiger modes. Though a pure silicon 50 nm thin film photodiode (Takeshi Yoshida, Yusuke Ohtomo, Masakazu Shimaya, "A Novel p-i-n Photodetector Fabricated on SIMOX for 1 GHz 2V CMOS OEICs"; IEEE Int. Electron Device Meeting, Wash., D.C. 1998, pp. 29–32) operating in avalanche mode is capable of matching the responsivity of a bulk vertical pn-junction photodiode, such as those used in known CMOS image sensors, the reasons for the identical value of responsivity are quite different. While a thick photodiode can absorb nearly all incident optical power, it has unity current gain, i.e., for each absorbed photon there is one electron-hole pair generated. On the other hand, a thin-film avalanche photo-detector absorbs only a fraction of the incident optical power, but its current gain can far exceed unity, i.e., for each absorb photon many electron-hole pairs can be generated—the avalanche effect.

For the same responsivity value, the avalanche p-i-n photodiodes can have better signal-to-noise ratio (S. M. Sze, "Physics of Semiconductor Devices", Wiley, New York 1981, page 767, Eq. 38, and page 770), especially if made with high quality epitaxially deposited single crystal films. This is highly relevant for low light intensity. A recent proposal (D. C. Herbert and E. T. R. Chidley, "Very Low Noise Avalanche Detection", IEEE Trans. Elect. Dev., Vol. 48, No. 7, July 2001, pp. 1475–1477) shows that with high frequency AC bias of the photodiode, it is even possible to avoid the noise-related drawbacks associated with avalanche processes in semiconductors, while keeping the advantage of large gain.

The coefficient of absorption for a particular wavelength is dependent on the band structure of the photo-detector material. Thus with band-gap engineering it is possible for a thin-film active layer to absorb nearly as much incident optical power as a "thick-film" (or bulk) photodiode made with a different material. With the introduction of optimized doping and of alloy profile/composition, it is thus possible for a thin-film avalanche p-i-n photodiode to have high current gain, and simultaneously be as efficient as a bulk photodiode in absorbing nearly all incident optical power for particular ranges of wavelengths.

For the longer wavelengths of the visible spectrum and for the IR, the p-i-n photodiodes can be made, preferentially, with random alloys and/or superlattice films of pseudomorphic $Si_{1-x-y}Ge_xC_y$, with a specific range of germanium and carbon atomic concentrations. This feature results in a reduction of band-gap with respect to Si, for increased photo-absorption efficiency of all primary colors in the visible, Red, Green, and Blue, and also in the Infra-Red (IR). Further, high levels of carbon incorporation provide strain-compensation to $Si_{1-x}Ge_x$, thereby increasing the critical thickness of $Si_{1-x}Ge_x$ films with high germanium content. By itself the incorporation of carbon also decreases the band-gap, by lowering the conduction band edge (with respect to silicon). Thus, there are device- and manufacturing-related advantages from simultaneous high Ge and C levels in the films.

In addition, p-i-n photodiodes made with $Si_{1-x-y}Ge_xC_y$, have more degrees of freedom, compared to Si or SiGe, for optimization of the thickness, doping profiles, alloy and heterojunction profiles, of the photodiode film, to operate in Unity-gain mode, Avalanche mode, and Geiger mode (single-photon counting mode).

Therefore, the signal amplitude and signal-to-noise ratio of thin-film p-i-n photodiodes can surpass that of conventional "bulk" photodiodes. These optimized profiles can also be used for adjustment of the operating voltage of the avalanche heterojunction p-i-n photodiode, according to the limitations of the CMOS logic circuitry into which the photodiode is embedded. For a given thickness of the photodiode film, the lower the band-gap of the active-layer the lower the required bias to enable avalanche processes.

Also, with $Si_{1-x}Ge_x$ and $Si_{1-x-y}Ge_xC_y$ films strained to silicon, not only a strong reduction of the band-gap with respect Si is obtained, but band-gaps even smaller than that of bulk germanium (i.e. smaller than about 0.67 eV) become possible. Therefore, $Si_{1-x-y}Ge_xC_y$ films with such small band-gaps ought to have even larger absorption coefficients (or conversely shorter penetration depth) for the same wavelength than bulk Ge, and less active volume (thickness of the photo-absorbing layer) is required to capture a given percentage of the incoming photons of a particular wavelength.

Moreover, detection of even longer IR wavelengths (longer than what bulk Ge can capture) becomes possible. And even though pseudomorphic $Ge_{1-y}C_y$ (germanium-carbon random alloys without silicon) have successfully been deposited on silicon (M. Todd et al, "Synthesis and Characterization of Heteroepitaxial Diamond-structured $Ge_{1-x}C_x$ (x=1.5–5.0%) Alloys Using Chemical Vapor Deposition", Appl. Phys. Lett. 68, No. 17, 22 Apr. 1996, pp. 2407–2409), neither such extreme alloy composition ($Ge_{1-y}C_y$), nor perfect strain compensation are deemed necessary for the purposes of efficient photo-detection of visible light or 1.3 $\mu$m and 1.55 $\mu$m wavelengths.

Thin-films of other materials, such as PbTe or $Pb_{1-x}Sn_xSe$, could also be grown or deposited pseudomorphically on silicon for detection of mid- to far-IR wavelengths.

Similarly, it is possible to include materials and/or structures capable of "solar blind" UV detection. "Solar blind" structures, meaning structures that are transparent to visible and IR wavelengths, can be achieved through the epitaxial growth of semiconductor structures and materials with band-gaps wider than that of silicon, such as GaN, AlN, AlGaN, etc. "Solar blind" UV detection can also be achieved with silicon-based quantum wells and/or superlattices of epitaxially compatible insulators, such as $Al_2O_3$, $LaAlO_3$, $Pr_2O_3$, $CeO_2$, $CaF_2$, $SrTiO_3$, etc.

Quantum wells induce the formation of localized energy subbands, which either through transitions from the valence-band to the conduction band (interband transitions), or through transitions within the valence-band or with the conduction-band (intra-subband transitions), shift the absorption edge to photons of higher energy (shorter wavelength) and even permit wavelength-selective photo-absorption.

A shift of the absorption edge towards photons of higher energy (shorter wavelength) can also be achieved with short period superlattices of silicon and a material with a larger band-gap, such as $Al_2O_3$, $LaAlO_3$, $Pr_2O_3$, $CeO_2$, $CaF_2$, $SrTiO_3$, etc. These structures induce delocalized subbands, leading to the formation of "minibands" with a band-gap magnitude between the band-gaps of the constituent materials.

In addition, the unique integrated process flow/architecture according to this invention provides a path for an easy incorporation of other advanced devices, along with the photodiode films themselves, leading to improvements in overall performance and bringing new functionality to the System-on-a-Chip (SoC).

During the same epitaxial process used to fabricate the photodiode films, other films can also be deposited. Prior to the growth/deposition of the photodiode films, random alloys, quantum wells and/or superlattices of $Si_{1-x-y}Ge_xC_y$, $Si_{1-x}Ge_x/Si_{1-y}C_y$, can also be grown/deposited. The extra films can be used for solid-state Heterojunction Integrated Thermionic (HIT) micro-coolers based on $Si_{1-x-y}Ge_xC_y$ random alloys and/or $Si_{1-x}Ge_x/Si_{1-y}C_y$ QWs and/or super-lattices (Xiaofeng Fan et al, "SiGeC/Si Superlattice Microcoolers", Appl. Phys. Lett. 78, No. 11, 12 Mar. 2001, pp. 1580–1582). Micro-cooler films can thus be positioned immediately under the light sensing layers, in intimate thermal contact with the films to be cooled down, which is the most favorable arrangement for highly efficient cooling of the photodiode layers.

It should be noticed that with this arrangement, the thin-film photodiode layers present a very small mass to be cooled, in contrast with the conventional light sensor architectures (CCDs and CMOS imagers) where the light absorbing region is part of the bulk of the substrate. Furthermore, there are indications that micro-cooler films with reduced lateral dimensions present nonlinear effects making them more efficient.

Briefly, there are many advantages to the fabrication of very large two-dimensional arrays of light sensors according to the present invention.

BRIEF DESCRIPTION OF THE DRAWINGS

FIGS. 11a–l illustrate one embodiment of a possible process flow for integration of epitaxial Micro-cooler and SiGeC photodiode with CMOS.

DESCRIPTION OF THE INVENTION

Figure 1:
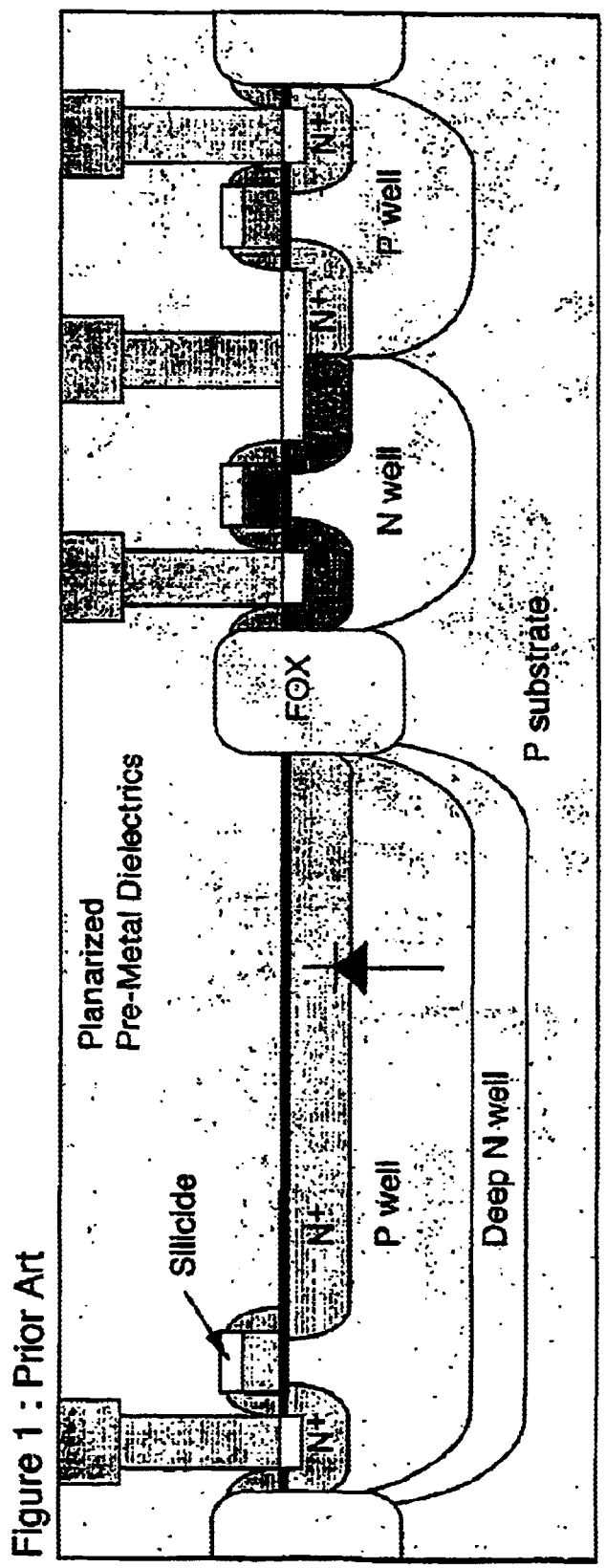
FIG. 1 shows a cross-sectional view of a conventional CMOS imager sensor.

The present invention is based on the following knowledge. For active media made of bulk semiconductor materials, that is, without quantum confinement in any of the three spatial directions, the absorption depth for a given photon energy or wavelength (color) is determined by the band-structure of the bulk material.

The absorption efficiency of a semiconductor material for photons varies as a function of wavelength. For wavelengths around 650 nm, the coefficient of absorption of germanium is about 50 times larger than that of silicon, or conversely, for that wavelength, the same amount of light can be absorbed in a Ge film 50 times thinner than in Si (S. M. Sze, "Physics of Semiconductor Devices", Wiley, New York 1981, p.750, FIG. 5).

It is known that the absorption properties of a given semiconductor material can be changed by alloying with other materials and/or by "quantization effects" resulting from "reduced dimensionality" in at least one spatial direction. The best known and easiest way to fabricate "reduced dimensionality" structures are Quantum Wells (QWs), Multiple Quantum Wells (MQWs), and Short-Period Superlattices.

Typically these structures are fabricated through epitaxial (pseudomorphic) deposition of heterojunctions in the vertical direction (perpendicular to the plane of the substrate). Epitaxial growth, with capability of atomic mono-layer control over the film deposition process, provides a straightforward means to engineer the composition and "dimensionality" of the structures in the vertical direction. Alloying and quantization effects can be combined to enhance each other's effects.

In the silicon materials system, $Si_{1-x}Ge_x$, $Si_{1-y}C_y$, $Si_{1-x-y}Ge_xC_y$ or $Ge_{1-y}C_y$ random alloys and/or QWs and/or superlattices, provide the means to do band-gap engineering on a silicon wafer substrate. $Si_{1-x}Ge_x$ stands for silicon-germanium random alloy, and $Si_{1-y}C_y$ stands for silicon-carbon random alloy, which should not to be confused with Silicon Carbide (SiC). $Si_{1-x-y}Ge_xC_y$ stands for random silicon-germanium-carbon alloy, and should not to be confused with germanium-doped Silicon Carbide. $Ge_{1-y}C_y$ stands for germanium-carbon random alloy (M. Todd et al, "Synthesis and Characterization of Heteroepitaxial Diamond-structured $Ge_{1-x}C_x$ (x=1.5–5.0%) Alloys Using Chemical Vapor Deposition", Appl. Phys. Lett. 68, No. 17, 22 Apr. 1996, pp. 2407–2409). $Ge_{1-y}C_y$ alloys can be looked at as a particular case of the more generic compound $Si_{1-x-y}Ge_xC_y$, where x+y=1, that is, without silicon atoms.

$Si_{1-x}Ge_x$ thin-films strained to silicon substrates have decreasing band-gap with increasing germanium content, mainly by shifting of the valence-band edge. $Si_{1-y}C_y$ thin-films strained to silicon, have also decreasing band-gap, but mainly by the lowering the conduction-band edge (O. G. Schmidt and K. Eberl, "Photoluminescence of Tensile Strained, Exactly Strain Compensated, and Compressively Strained $Si_{1-x-y}Ge_xC_y$ Layers on Si", Phys. Rev. Lett., Vol. 80, No. 15, 13 Apr. 1998, pp. 3396–3399). Therefore, $Si_{1-y}C_y$ films are useful for the confinement of electrons, in a similar way that $Si_{1-x}Ge_x$ layers are useful for the confinement of holes.

Very high quality $Si_{1-x}Ge_x$ layers have been demonstrated and are in production, delivering silicon-based heterojunction bipolar transistors (HBTs) for BiCMOS circuits (D. C. Ahlgren, et al, "Manufacturability Demonstration of an Integrated SiGe HBT Technology for the Analog and Wireless Marketplace", IEEE Int. Electron Device Meeting, Wash., D.C., 1996, pp. 859–886).

These circuits offer leading edge performance for wireless-related communications products. More recently, $Si_{1-x-y}Ge_xC_y$ films have also been demonstrated to be production worthy, mainly for the processing-related advantages of carbon containing layers ("K. E. Ehwald et al, Modular Integration of High-Performance SiGe:C HBTs in a Deep Submicron, Epi-Free CMOS Process", Int. Electron Device Meeting, Tech. Digest, 1999).

The addition of carbon to $Si_{1-x}Ge_x$ films has been demonstrated to bring many benefits both from device physics and technology standpoints. From the technology standpoint, the addition of carbon to the $Si_{1-x}Ge_x$ film reduces the strain (strain-compensation) and allows either thicker films with the same Ge content, or increased Ge content for the same film thickness. $Si_{1-x-y}Ge_xC_y$ strain-free films can be formed when the ratio of Ge to C atoms is somewhere between 8.2 to 1 and 9.4 to 1 (see Karl Eberl et al, "Growth and Strain Compensation Effects in the Ternary $Si_{1-x-y}Ge_xC_y$ Alloy System, Appl. Phys. Lett., Vol. 60, 1992, pp.3033–3035, and also [13] H. J. Osten, E. Bugiel, and P. Zaumseil, "Growth of an Inverse Tetragonal Distorted SiGe Layer on Si(001) by Adding Small Amounts of Carbon", Appl. Phys. Lett., Vol. 64, 1994, pp.3440–3442). It has also been shown that the incorporation of substitutional carbon in these $Si_{1-x-y}Ge_xC_y$ films largely suppresses the diffusion of p-type and n-type dopants (see K. E. Ehwald et al, "Modular Integration of High-Performance SiGe:C HBTs in a Deep Submicron, Epi-Free CMOS Process", Int. Electron Device Meeting, Tech. Digest, 1999), thereby enabling sharper doping profiles.

The Selective Epitaxial Growth (SEG) of silicon and/or $Si_{1-x}Ge_x$ films with varied doping and heterojunction profiles has been demonstrated for different types of devices and applications.

One application is "Elevated Source/Drains", proposed as an architectural option to help scale planar CMOS architecture to the 0.1 μm technology generation, with special attention to the PMOS device (Hsiang-Jen Huang et al, "Improved Low Temperature Characteristics of P-Channel MOSFETs with $Si_{1-x}Ge_x$ Raised Source and Drain", IEEE Trans. Electron Devices, Vol. 48, No. 8, August 2001, pp.1627–1632). In this case, the films are heavily p-type doped, while the selectivity of the growth process is maintained.

Other devices made by Selective Epitaxial Growth (SEG) are Infra-Red (IR) detectors consisting of SiGe p-i-n photodiodes (Adrian Vonsovici et al, "Room temperature Photocurrent Spectroscopy of SiGe/Si p-i-n Photodiodes Grown by Selective Epitaxy", IEEE Trans. Elect. Dev., Vol. 45, No.2, February 1998, pp.538–542). For this device. n-type doped films were also selectively grown and it has been observed that strained epitaxial films in dielectric windows have a larger critical thickness compared to films deposited with the same process parameters and with the same composition, but formed on blanket substrates.

In summary, the epitaxial pseudomorphic deposition of $Si_{1-x}Ge_x$, $Si_{1-y}C_y$, $Si_{1-x-y}Ge_xC_y$ random alloys and/or QWs and/or superlattices allows the formation of strain-compensated films with a band-gap much narrower than that of silicon, and thus significantly changes the optoelectronic properties of devices made with silicon-based technologies.

In addition to $Si_{1-x-y}Ge_xC_y$ alloys, thin-films of materials with even narrower band-gaps, such as PbTe or $Pb_{1-x}Sn_xSe$ for example, can also be used. These materials enable the photo-detection of mid- to far-IR, monolithically integrated with CMOS.

"Solar blind" UV photo-detectors integrated with CMOS can also be made with the epitaxial growth and/or deposition of materials and structures, such as quantum wells and short period superlattices, of wide band-gap semiconductors and insulators which are compatible with-silicon. Additionally, films such as AlN GaN, and AlGaN may also be used. The research efforts towards the substitution of $SiO_2$ as the gate insulator of CMOS devices by another insulator with a large dielectric constant (High-K insulator), has demonstrated that pseudomorphic thin-films of materials such as $Al_2O_3$, $LaAlO_3$, $Pr_2O_3$, $CeO_2$, $CaF_2$, $SrTiO_3$, etc., can indeed be grown/deposited.

Short period superlattice structures of alternating materials induce delocalized energy states (subbands) leading to the formation of "minibands" with a band-gap magnitude between the band-gaps of the constituent materials. Thus it becomes possible to create synthetic band-structures whose gap, the difference between conduction and valence minibands, can be larger than silicon and can be tailored by controlling the growth and structural parameters of the superlattice.

It should also be kept in mind that some of the epitaxially compatible insulators have very asymmetric band-alignments with silicon. Generally, the valence-band offset (barrier height for holes) is much larger than the conduction-band offset (barrier height for electrons). For example it is known that $CdF_2$ and $SrTiO_3$ have negligible conduction band offsets with silicon. For cases such as these, the conduction miniband would also have negligible offset with respect to the conduction-band of silicon, hence all band-gap enlargement would occur in the valence-band.

With the gap of the miniband being larger than the energy of the shortest wavelength photons of the visible range (violet, $\lambda \approx 400$ nm, corresponding to $E \approx 3.1$ eV), the superlattice structure will be transparent to the visible range (and longer wavelengths), while absorbing UV radiation.

In accordance with the present invention, the photodiode films are epitaxially formed on $n^+$ active areas of MOSFETs, since they have higher mobility than $p^+$ silicon. This will help in optimizing readout speed. Also, from process technology standpoint, simple heterojunction and doping profiles can be easily obtained by forming p-i-n photodiodes on n-type regions only, thereby requiring only one type of doping to be incorporated during the epitaxial deposition process. This is a substantial advantage when using the most commonly used film deposition technology for production, that is Chemical Vapor Deposition (CVD) since with the latter, it is more difficult to achieve sharp doping profiles with n-type doping than with p-type doping.

For the particular case of $Si_{1-x-y}Ge_xC_y$ films strained to silicon, the heterojunction and doping profiles need careful design, because for $Si_{1-x-y}Ge_xC_y$, when the percentage of Carbon is small, the band-gap reduction occurs almost entirely in the valence-band. For operation in non-avalanche mode, the photodiode films should have as narrow a band-gap as possible, so that the light penetration depth can be as small as possible, for all wavelengths of interest.

Figure 2:
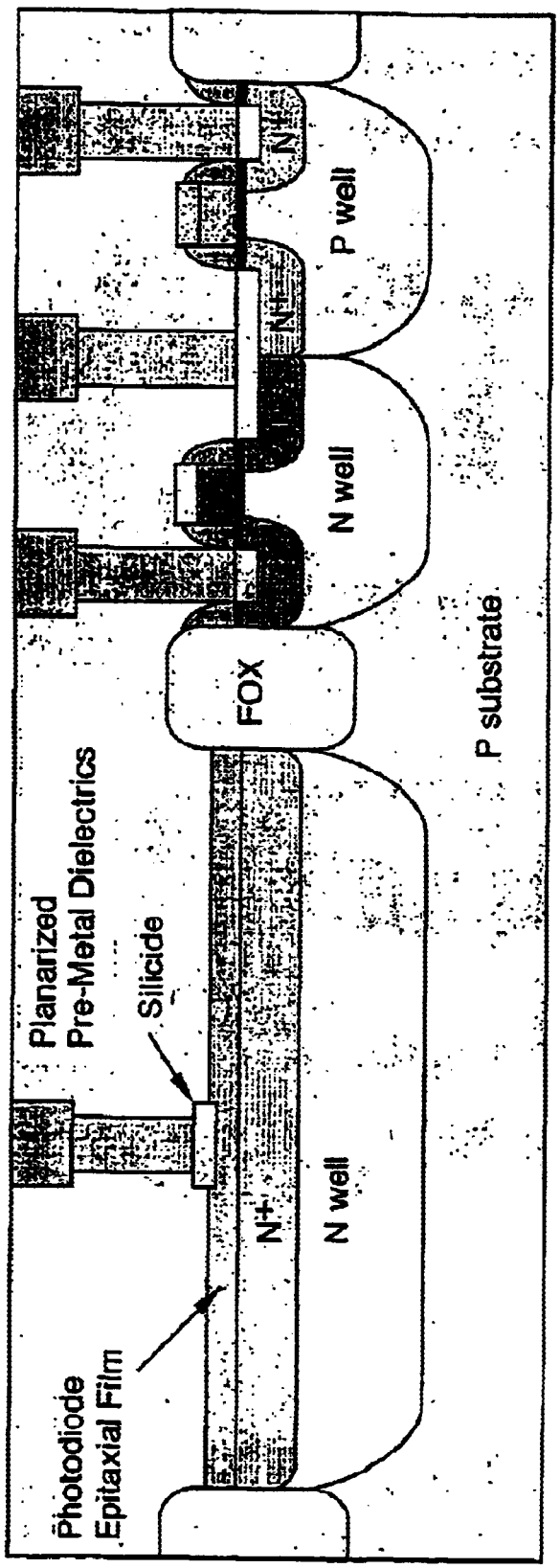
FIG. 2 shows a cross-sectional view of a photodiode module according to the present invention.

Referring now to FIG. 2 there is shown a cross-sectional view of a photodiode module according to the present invention. It is seen that the thin-film p-i-n photodiode is formed on a $n^+$ active area on top of a N-well, which was formed in a conventional CMOS process. At the top of the photodiode a small area is covered by a silicide film which provide the electrical contact to the top film of the photodiode.

Figure 3:
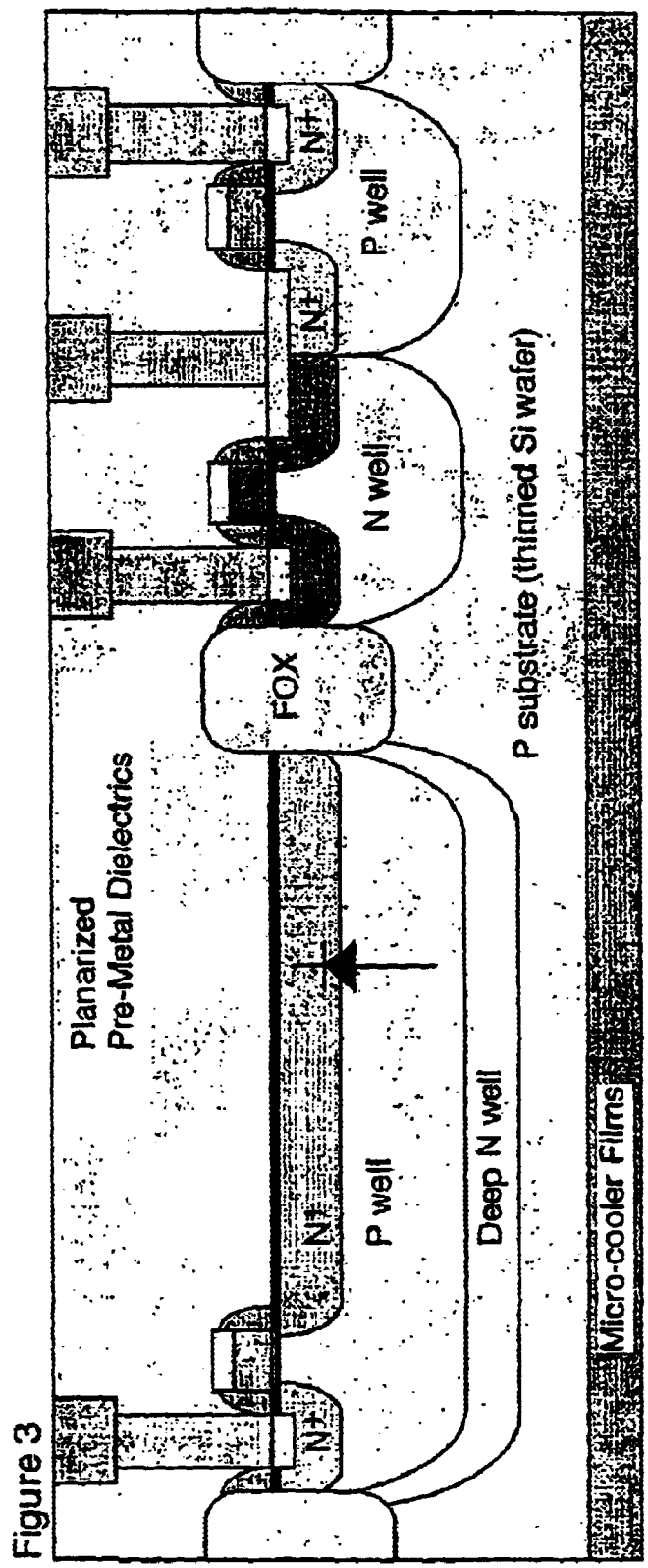
FIG. 3 shows a cross-sectional view of a possible arrangement of conventional CMOS photodiode with a micro-cooler module

FIG. 3 shows a cross-sectional view of a possible arrangement of conventional CMOS photodiode with a micro-cooler module. It is seen that the micro-cooler module is attached to the substrate from the backside. For that reason, it can also be seen that the micro-cooler films cannot be in intimate thermal contact with the photodiode's active region (bulk pn-junction).

Figure 4:
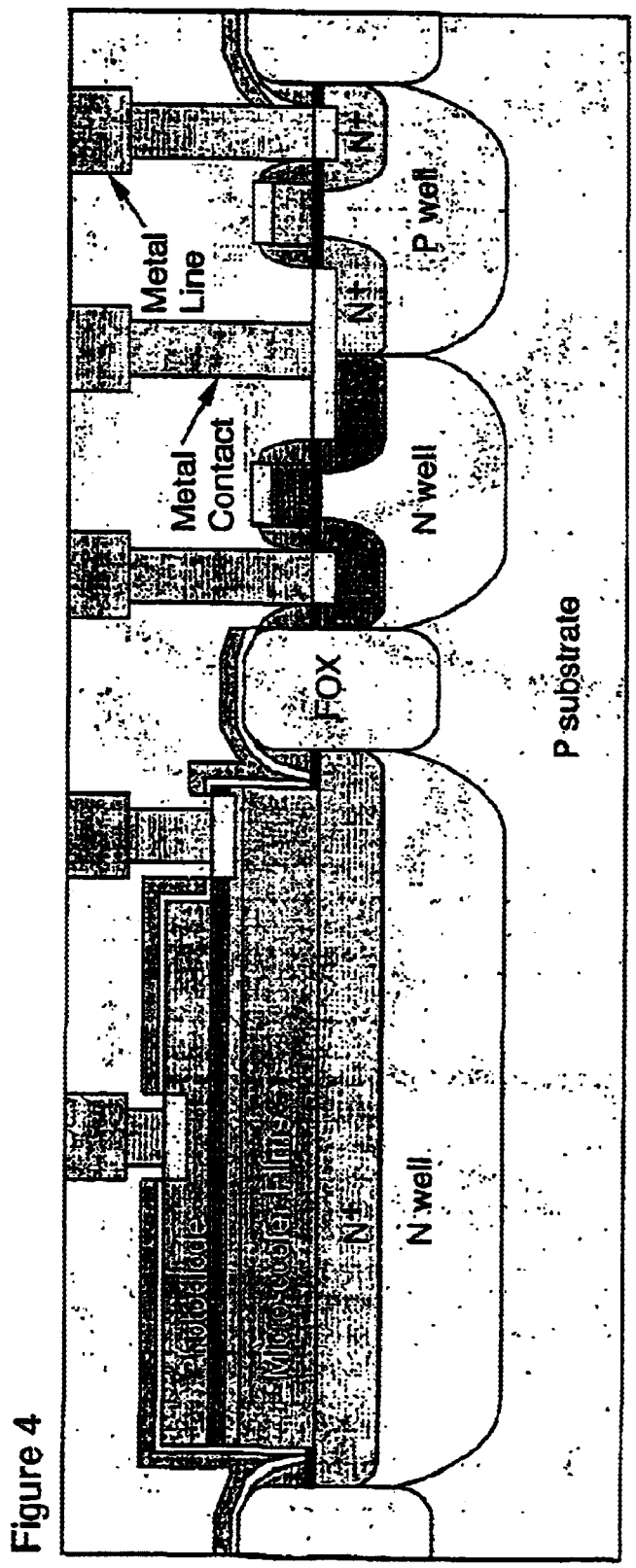
FIG. 4 shows a cross-sectional view of a photodiode module and micro-cooler module arranged according to the present invention

FIG. 4 shows a cross-sectional view of a photodiode module and micro-cooler module arranged according to the present invention. It is seen that the thin-film micro-cooler films are formed on a $n^+$ active area, and on top of them is p-i-n photodiode, thereby achieving monolithic integration.

FIGS. 5a–d show schematic views of the p-i-n photodiode layers for visible and IR wavelengths, and the corresponding band-diagrams. All of them depict photodiode layer deposited on $n^+$ active regions. Also in all cases, the Fermi-Level is inside the conduction-band for the n-doped regions, and that in the p-type doped layers the Fermi-Level is inside the valence-band. Therefore these two layers are highly conductive and excellent charge carrier reservoirs for photo-absorption and electron-hole photo-generation. All figures present the band-diagrams under reverse bias conditions.

Figure 5A:
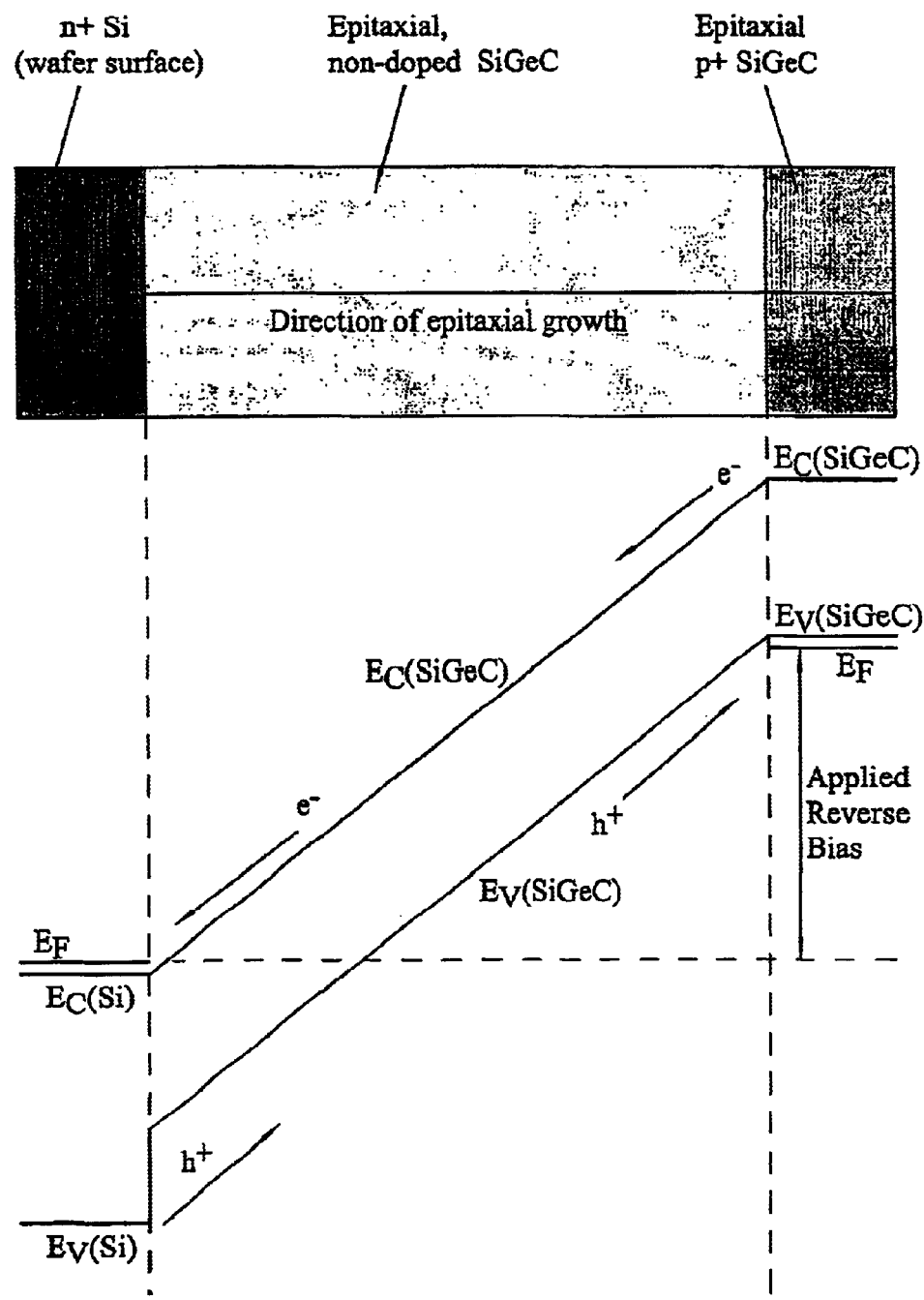
FIGS. 5a–d show schematic views of the p-i-n photodiode layers for visible and IR wavelengths, and the corresponding band-diagrams FIG. 6 schematically shows how color filtering/separation is obtained in conventional CCDs and CMOS imagers, for the 3 primary colors (RGB) in the visible range: One color pixel is composed of three subpixels, one for each of the primary colors.
Figure 5B:
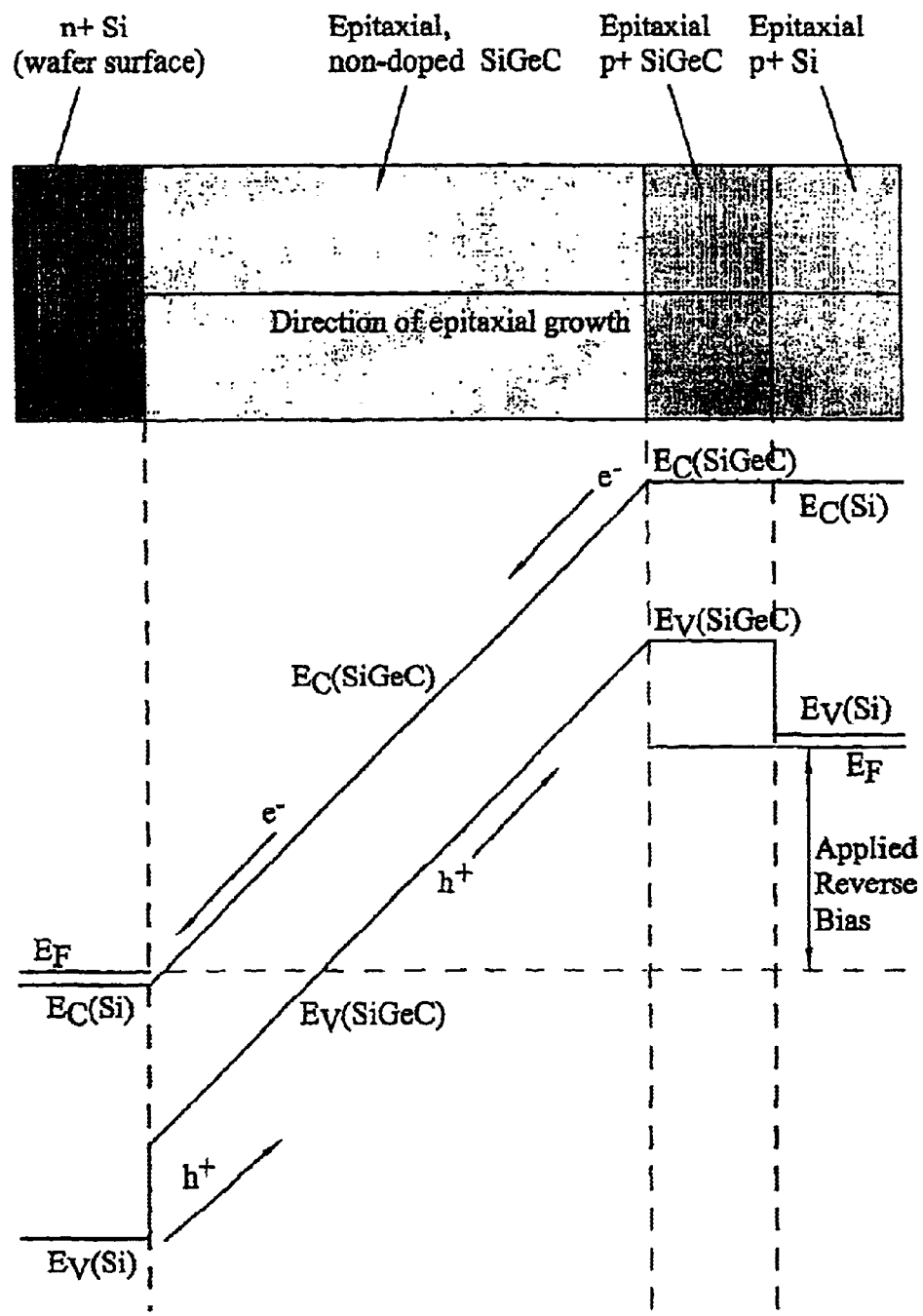
Figure 5C:
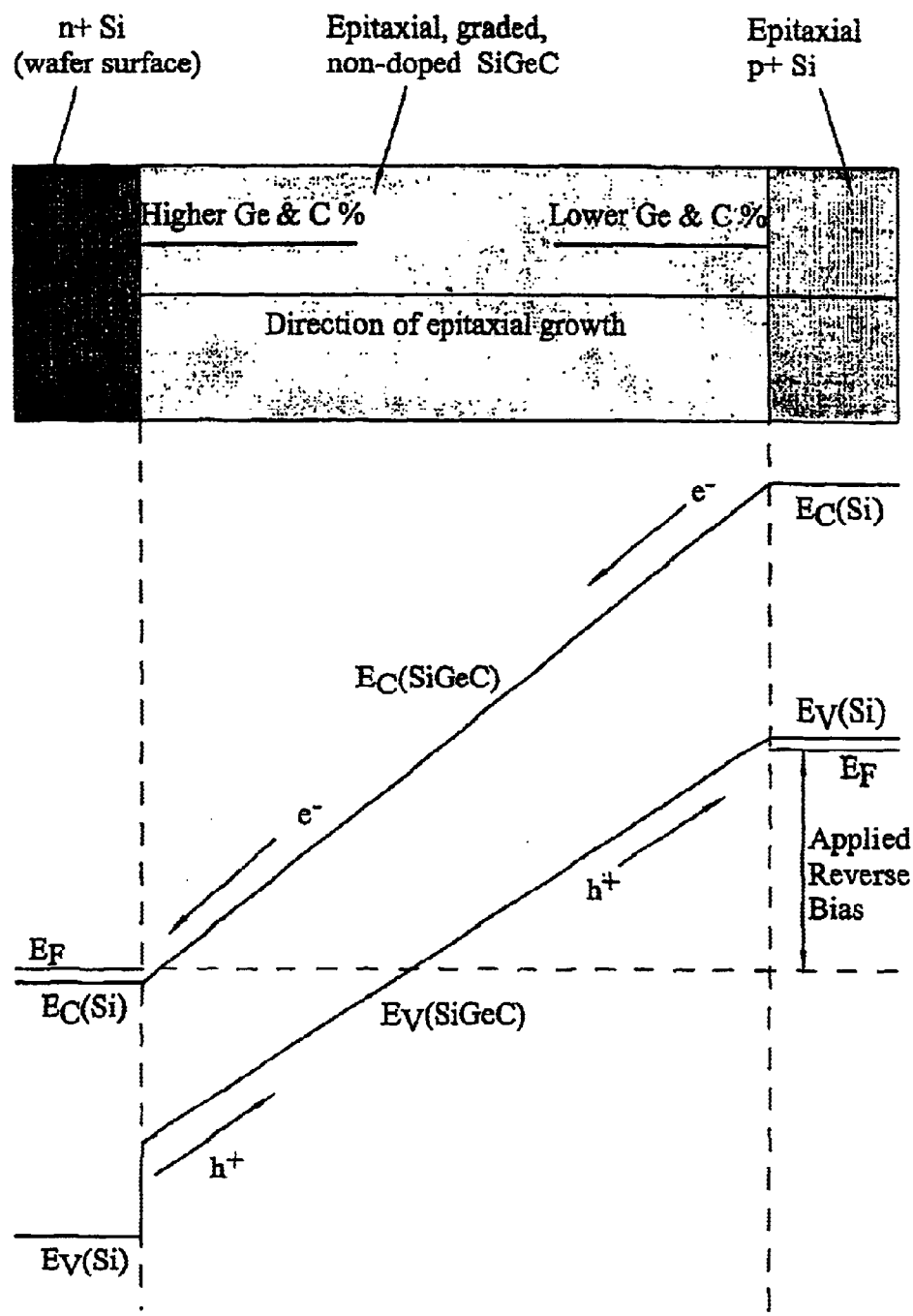
Figure 5D:
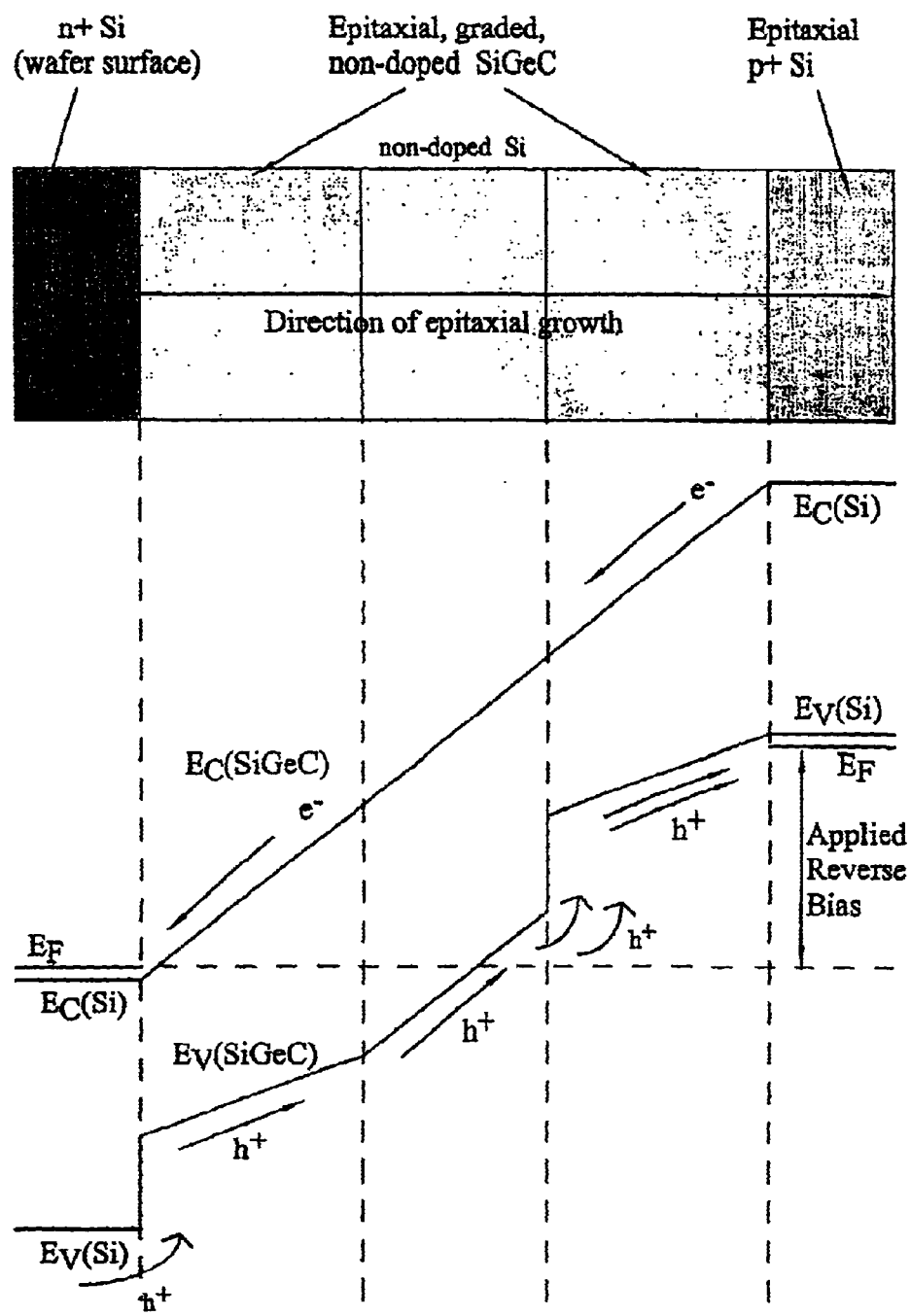

In FIG. 5a the intrinsic and the p-doped layers of the photodiode are depicted with a constant SiGeC alloy composition, hence a constant band-gap narrower than silicon's. FIG. 5b shows very similar layers and band-diagram as FIG. 5a, with the addition of a $p^+$-silicon layer on top of the $p^+$-SiGeC region. This $p^+$-silicon cap layer may be necessary to be partially consumed during the formation of a silicide. In FIG. 5c the intrinsic region of the photodiode is depicted with a graded SiGeC alloy composition, with the narrowest band-gap at the interface with the $n^+$-area, and the widest band-gap, transiting to silicon, at the interface with the $p^+$-doped region, which is made of non-alloyed silicon. In FIG. 5d the intrinsic region of the photodiode is depicted with a stack of a graded-SiGeC/silicon/graded-SiGeC. The profiles are such that, in addition to the applied electric field, the avalanche processes for holes are helped by the gain of kinetic energy when holes cross the region with the largest valence-band discontinuity.

Figure 7A:
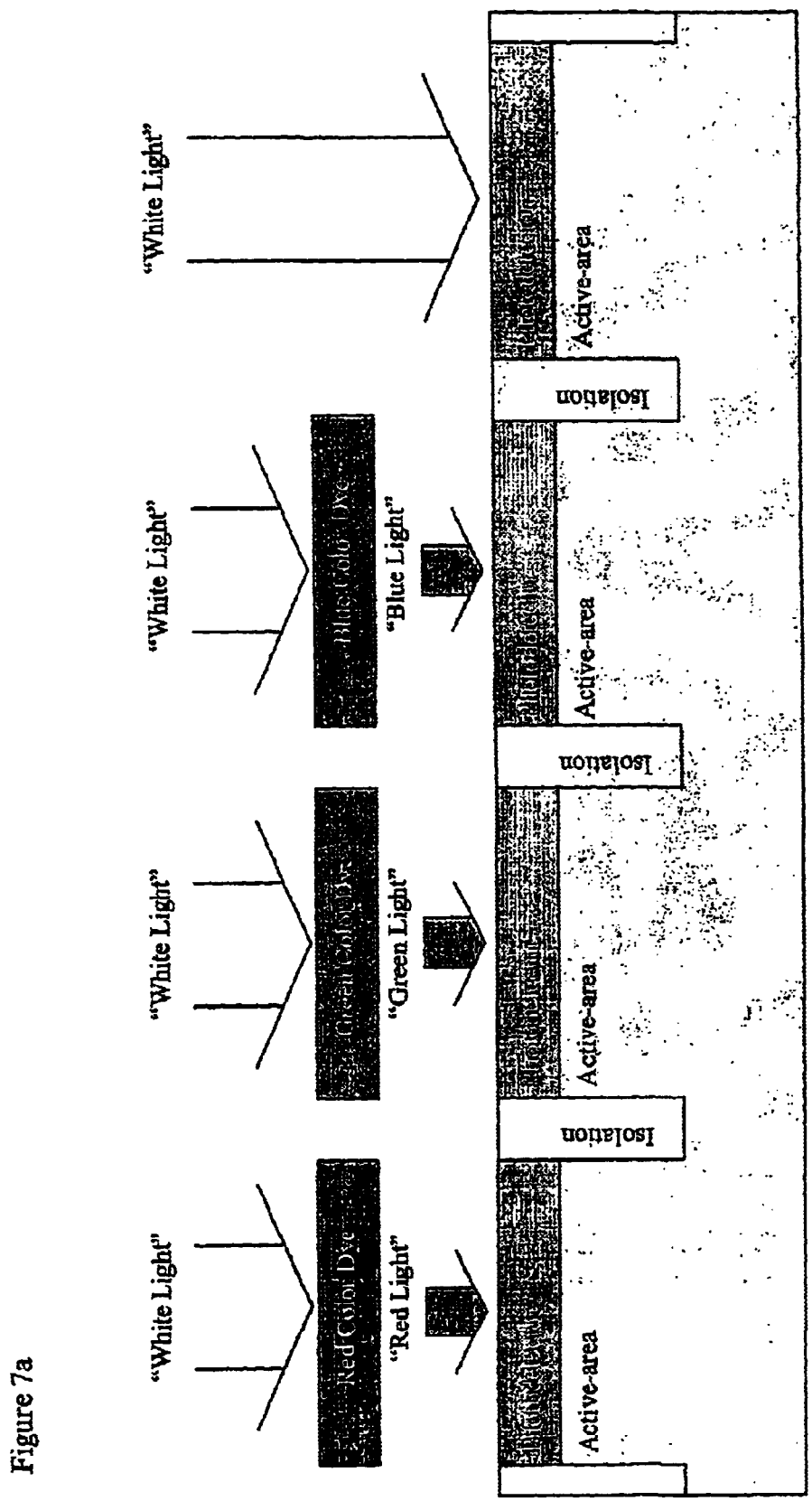
FIG. 7a schematically shows one possible choice for RGB and IR color filtering/separation, using wavelength filtering over the photodiode for capturing IR.

FIG. 6 schematically shows how color filtering/separation is obtained in conventional CCDs and CMOS imagers, for the 3 primary colors in the visible range—RGB. FIG. 7a schematically shows one possible choice for RGB and IR color filtering/separation. In this solution there is no wavelength filtering over the photodiode for capturing IR. For that reason, under daylight conditions, the IR subpixel captures "white light" images. Under very weak photon intensity in the visible range (e.g. nighttime), all photo-current generated by that photodiode will be due to broadband IR radiation. In daylight conditions, this subpixel can be biased appropriately to serve as a "solar-cell" and help to satisfy the power needs of the system that the image sensor is embedded into.

Figure 7B:
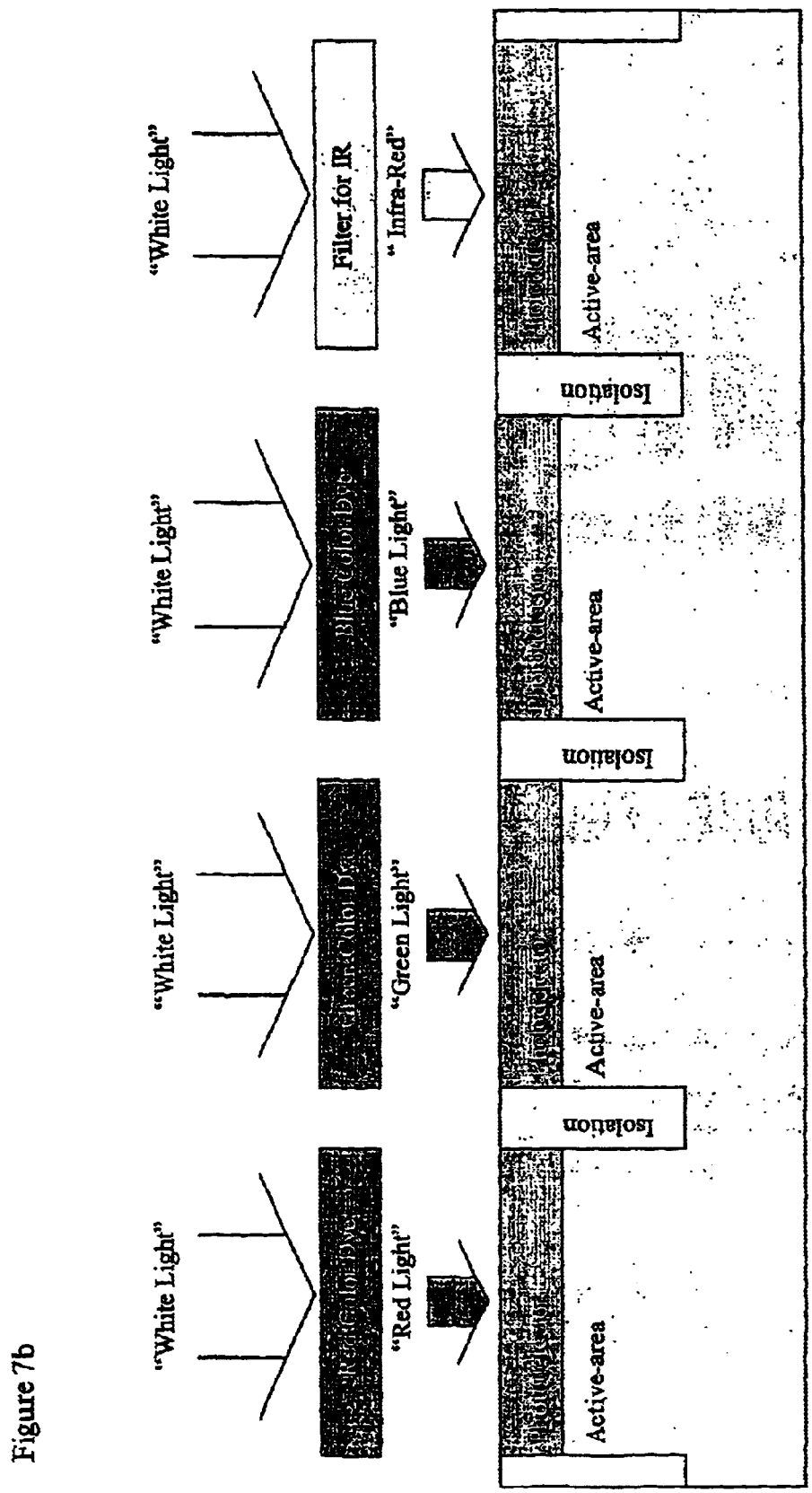
FIG. 7b schematically shows another possible choice for RGB and IR color filtering/separation, using wavelength filtering over the photodiode for capturing IR.

FIG. 7b schematically shows another possible choice for RGB and IR color filtering/separation. With this solution there is a wavelength filter over the photodiode for capturing IR, making it "solar blind". For that reason, even under daylight conditions, the IR subpixel does not capture images in the visible range, only in the IR radiation.

Figure 8:
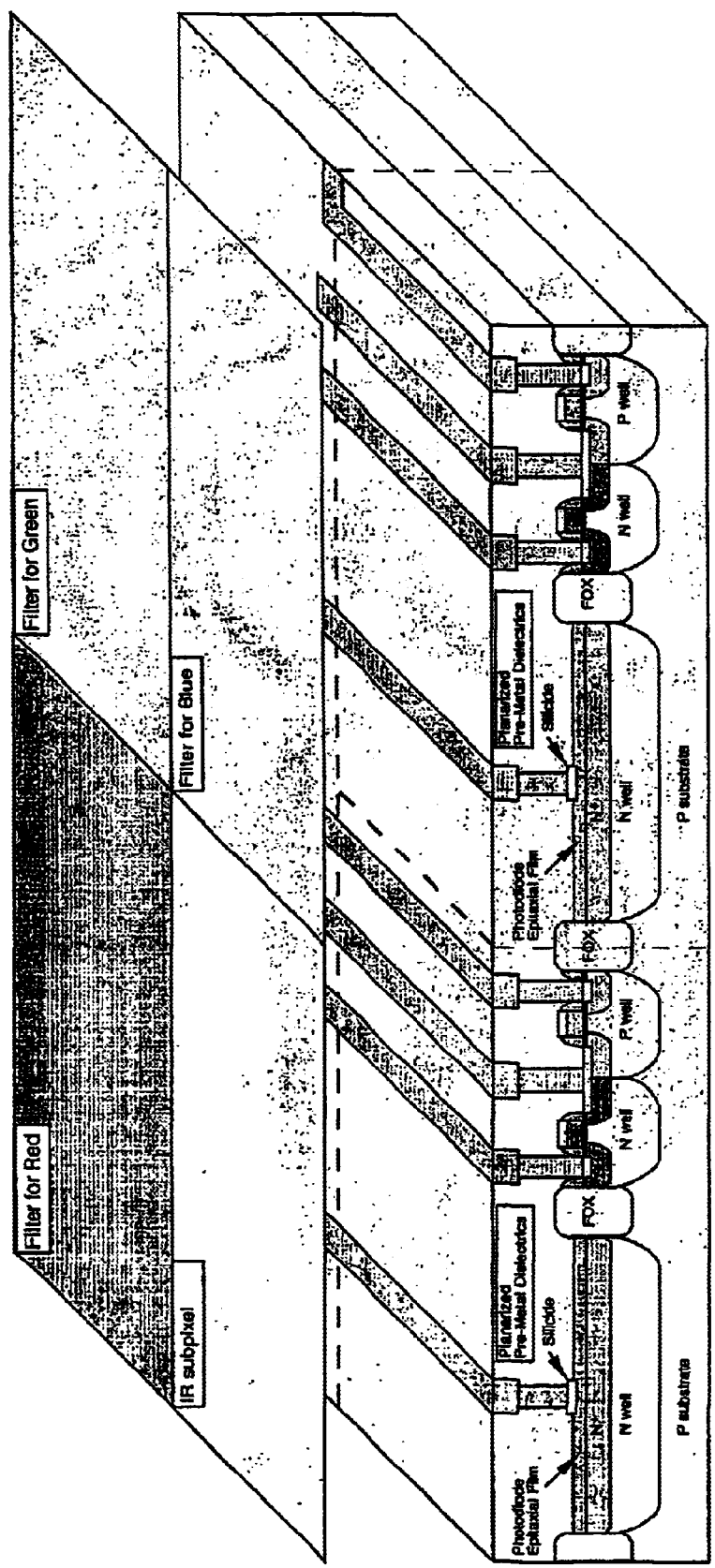
FIG. 8 shows a three-dimensional perspective of a "full color pixel" with subpixels for RGB and IR.

FIG. 8 shows a three-dimensional perspective of a "full color pixel" with subpixels for RGB and IR.

Referring now to FIGS. 9a–g, there is illustrated one embodiment of a possible process flow for integration of epitaxial SiGeC photodiode with CMOS. Deposition of $Si_3N_4$ followed by blanket or patterned etch back to form spacers, is common process step in CMOS processing. The patterned etch back of a $Si_3N_4$ film is the preferred method of fabricating high resistivity circuit elements, by providing $Si_3N_4$ films on top of non-doped poly-Si lines, to block the formation of silicide.

Figure 9A:
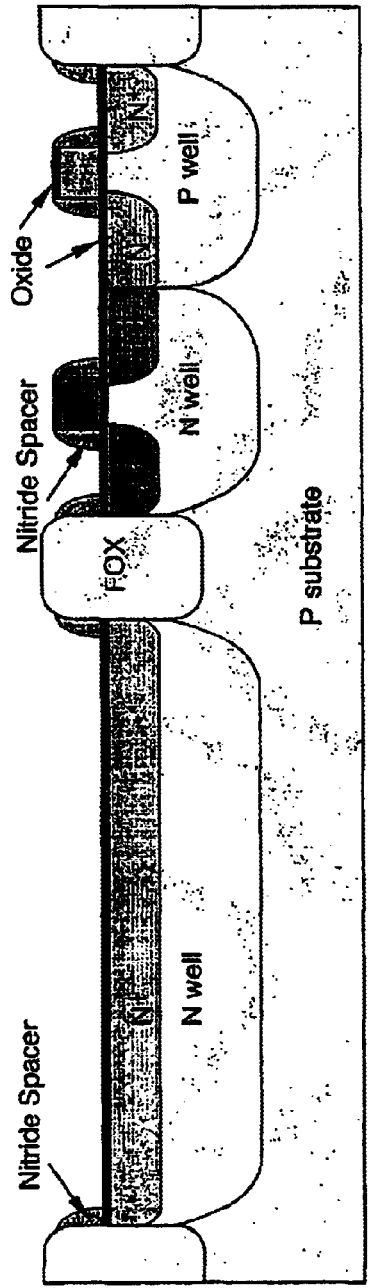
FIGS. 9a–g illustrate one embodiment of a possible process flow for integration of epitaxial SiGeC photodiode with CMOS.
Figure 9B:
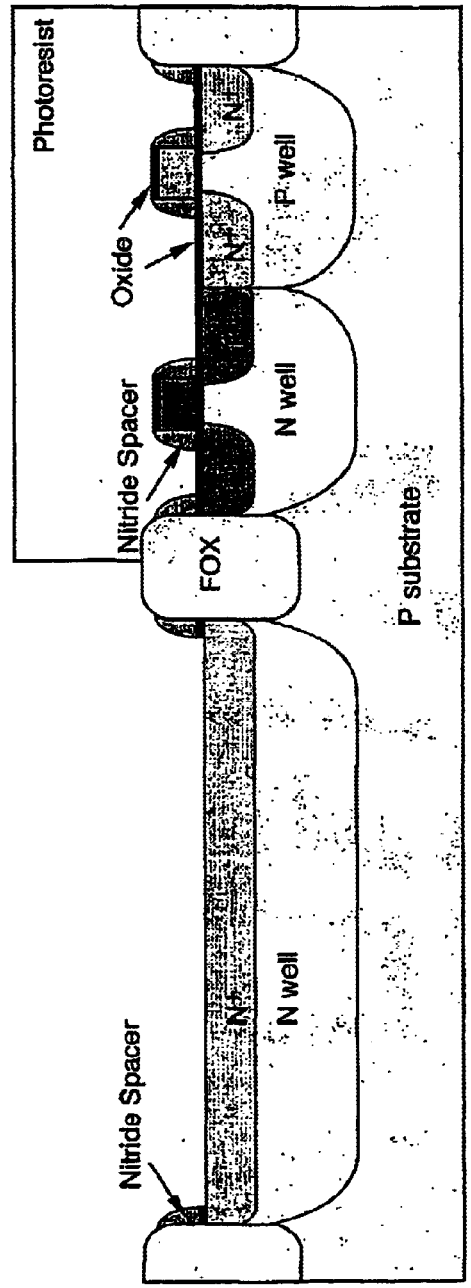

FIG. 9a shows a schematic cross-section of a silicon wafer substrate, after deposition and etch back of a silicon nitride ($Si_3N_4$) film. A double-well CMOS process is assumed. A triple-well can also be used, in which case the photodiode can be formed in a triple-well active area. The active area where the photodiode is to be made is separated of surrounding CMOS devices by Field Oxide (FOX) regions. As indicated in this figure, there is a thin Oxide ($SiO_2$) film covering the active areas, which was formed prior to the deposition & etch of the $Si_3N_4$ film. The exemplary process steps are described here below.

Figure 9C:
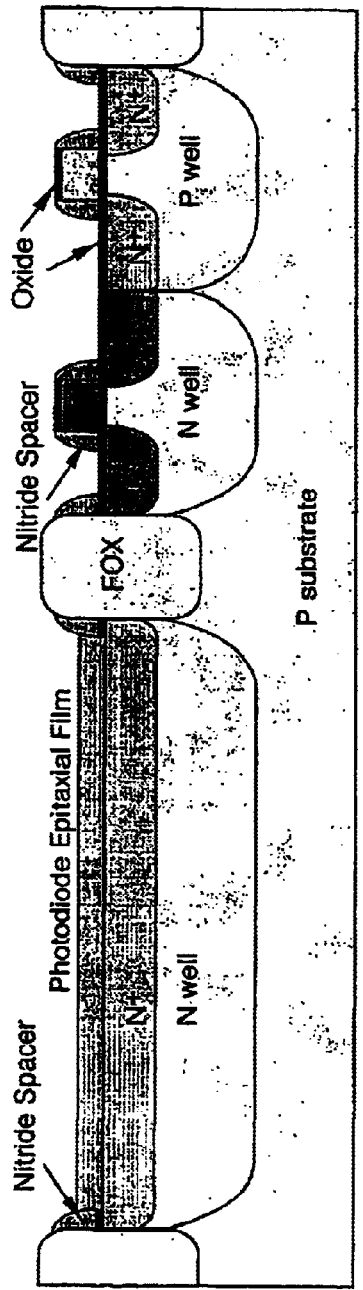

"Light Sensor Module"
1) Photolithography, leaving only the photodiode regions without photoresist;
2) Removal of thin oxide from silicon surface, for example with Dilute-HF (FIG. 9b)
3) Photoresist strip and clean;
4) SEG of photodiode layers with the appropriate alloy and doping profiles (FIG. 9c)

Figure 9D:
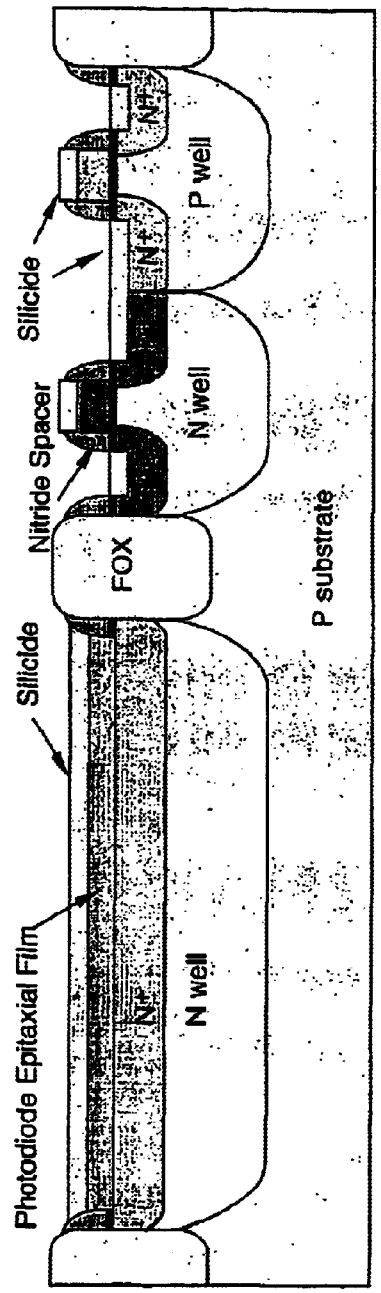
Figure 9E:
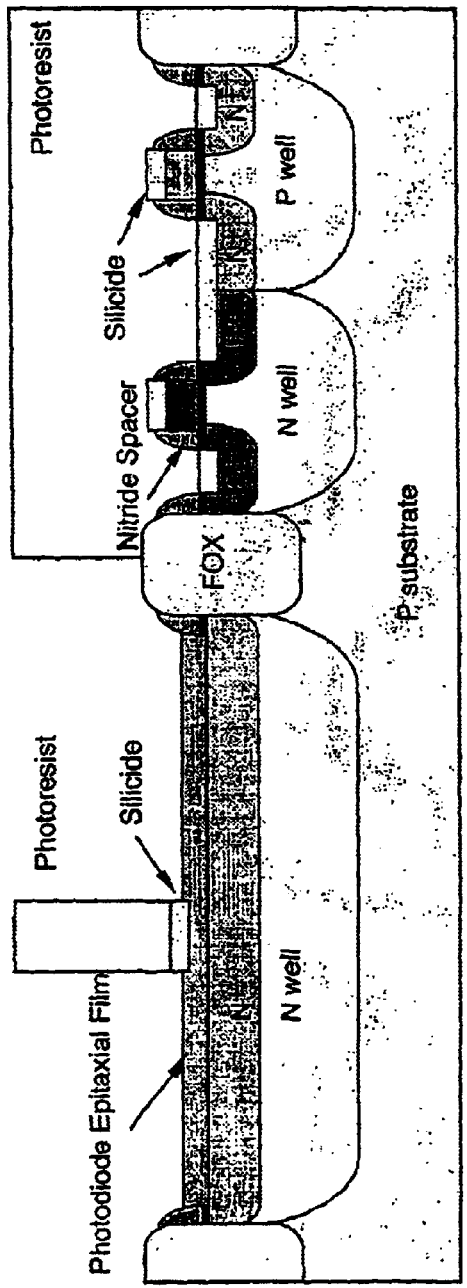

"Silicide Module"
5) Removal of thin oxide layer from poly-Si lines and junctions (e.g. with Dilute-HF);
6) Formation of silicide with conventional methods (FIG. 9d)

Figure 9F:
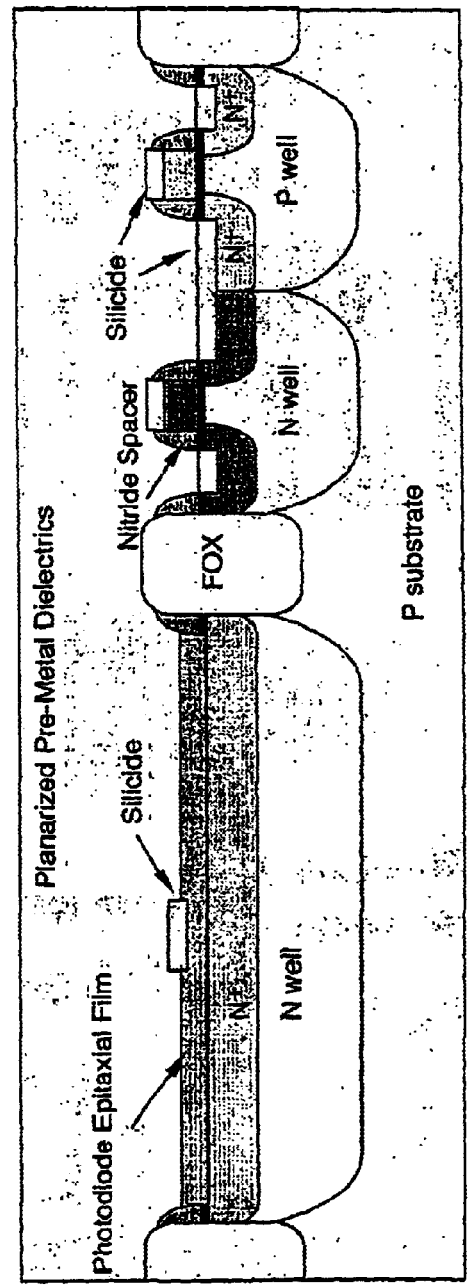

"Post-Silicide Module"
7) Photolithography, exposing (removing photoresist) only from photodiode regions where silicide is to be etched away;
8) Selective wet etch (for example with Buffered-HF) of silicide from most of the surface of the photodiode epitaxial layers, leaving only a small area for ohmic contact (FIG. 9e);
12) Photoresist strip and clean;
13) Deposition of Pre-Metal Dielectric layer(s);
14) Planarization (FIG. 9f)

"Standard Metallization"

Figure 9G:
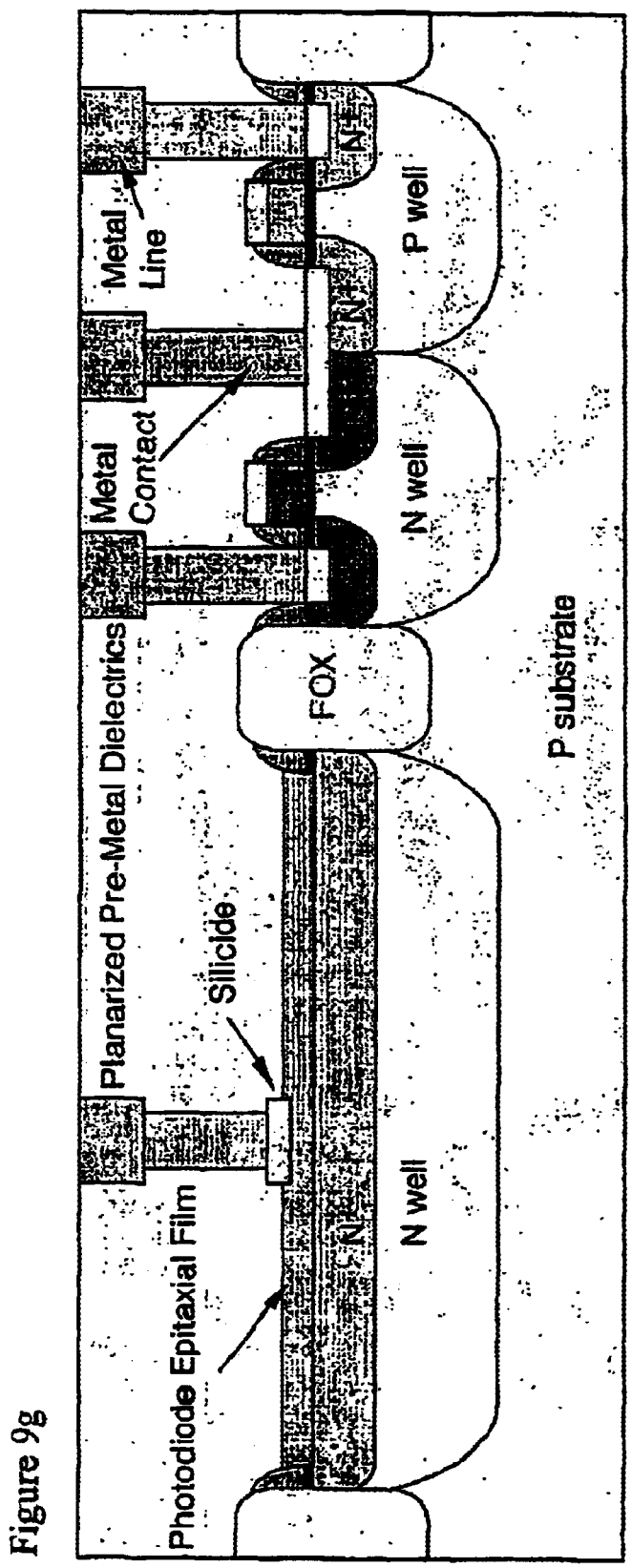

The existence of the photodiode should not affect the processing for interconnects. FIG. 9g shows only the metal contacts and the first metal level.

Referring to FIGS. 10 and 11, there is illustrated one exemplary process flow for integration of epitaxial micro-cooler and SiGeC photodiode with CMOS. The disclosed process integration architecture of photodiode and micro-cooler devices makes the bottom electrode of photodiode and the top electrode of micro-cooler to face each other in the epitaxial stack.

When the epitaxial films to be deposited are thicker than the protrusion of the field oxide (FOX) above the surface of the silicon wafer, it is necessary to provide additional "wall height" to laterally contain the selective growth of the epitaxial films. The total thickness of the photodiode films and micro-cooler films is likely to exceed the height of the protrusion of the field oxide above the silicon wafer surface. Therefore, it is required for the Selective Epitaxial Growth (SEG) process to be performed inside "windows" opened into thicker films. The process flow described below anticipates this situation and suggests a solution for it. Prior to the SEG process, deeper windows into a silicon nitride film are provided.

FIGS. 10a–d show schematic views of several possible layer stacks comprising the micro-cooler and the p-i-n photodiode films. A qualitative band-diagram is provided only to illustrate the impact of the different sequences of doping on the possible bias conditions. The band-diagrams are meant to be generic, and do not attempt to actually represent details of the alloy composition of either the micro-cooler or the photodiode layers.

Figure 10A:
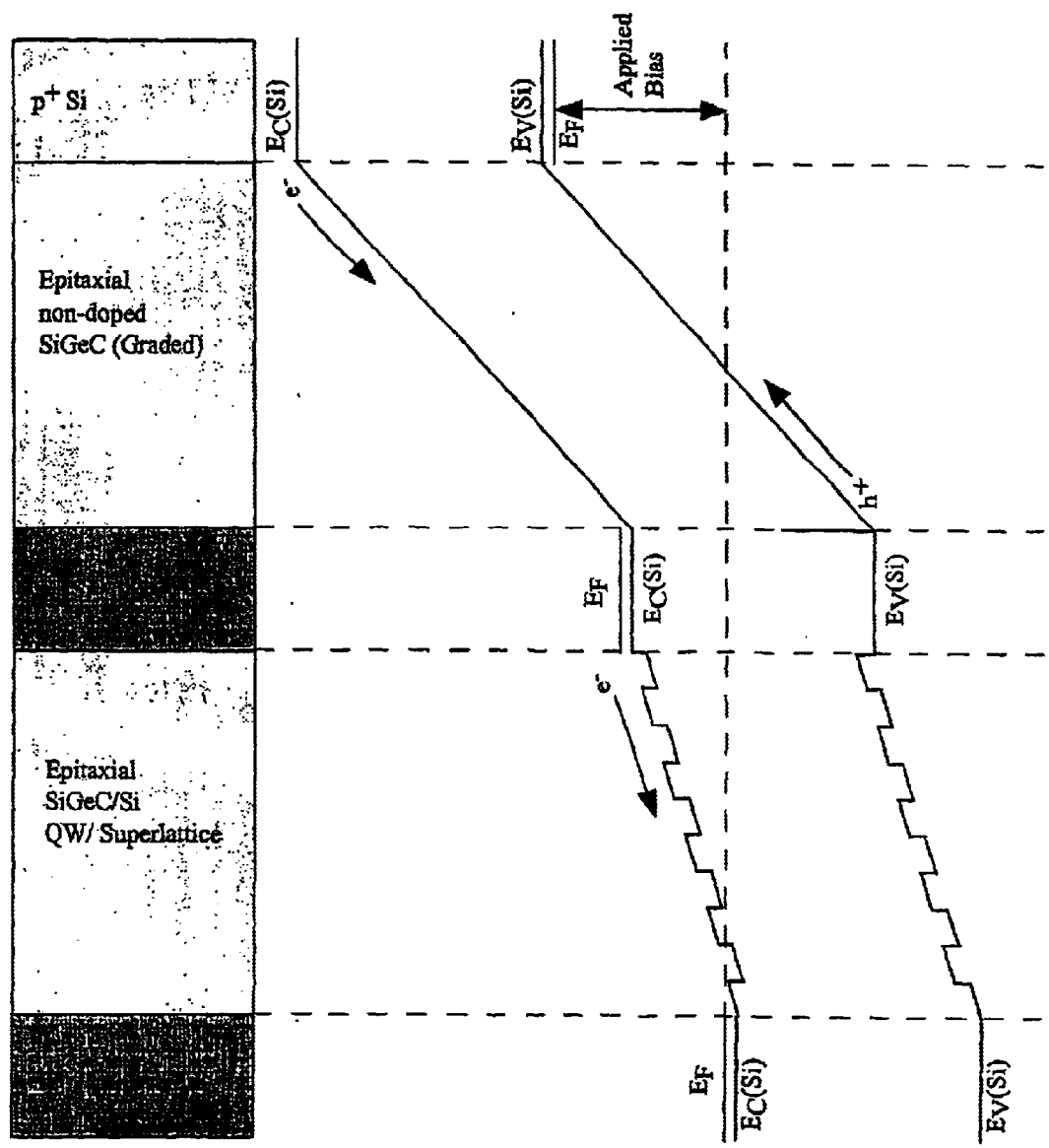
FIGS. 10a–d show schematic views of the layer stack comprising the micro-cooler and the p-i-n photodiode films, together with qualitative band-diagrams illustrating the impact of the different sequences of doping on the possible bias conditions.

FIG. 10a shows a micro-cooler with n-type doped terminals, where the top electrode of the micro-cooler shares the same $n^+$ layer with the bottom electrode of the photodiode, whose top electrode is $p^+$-doped. The band-diagram depicts a situation where bias is applied between the top electrode of the photodiode and the bottom electrode of the micro-cooler (contacted through the "well contact").

Figure 10B:
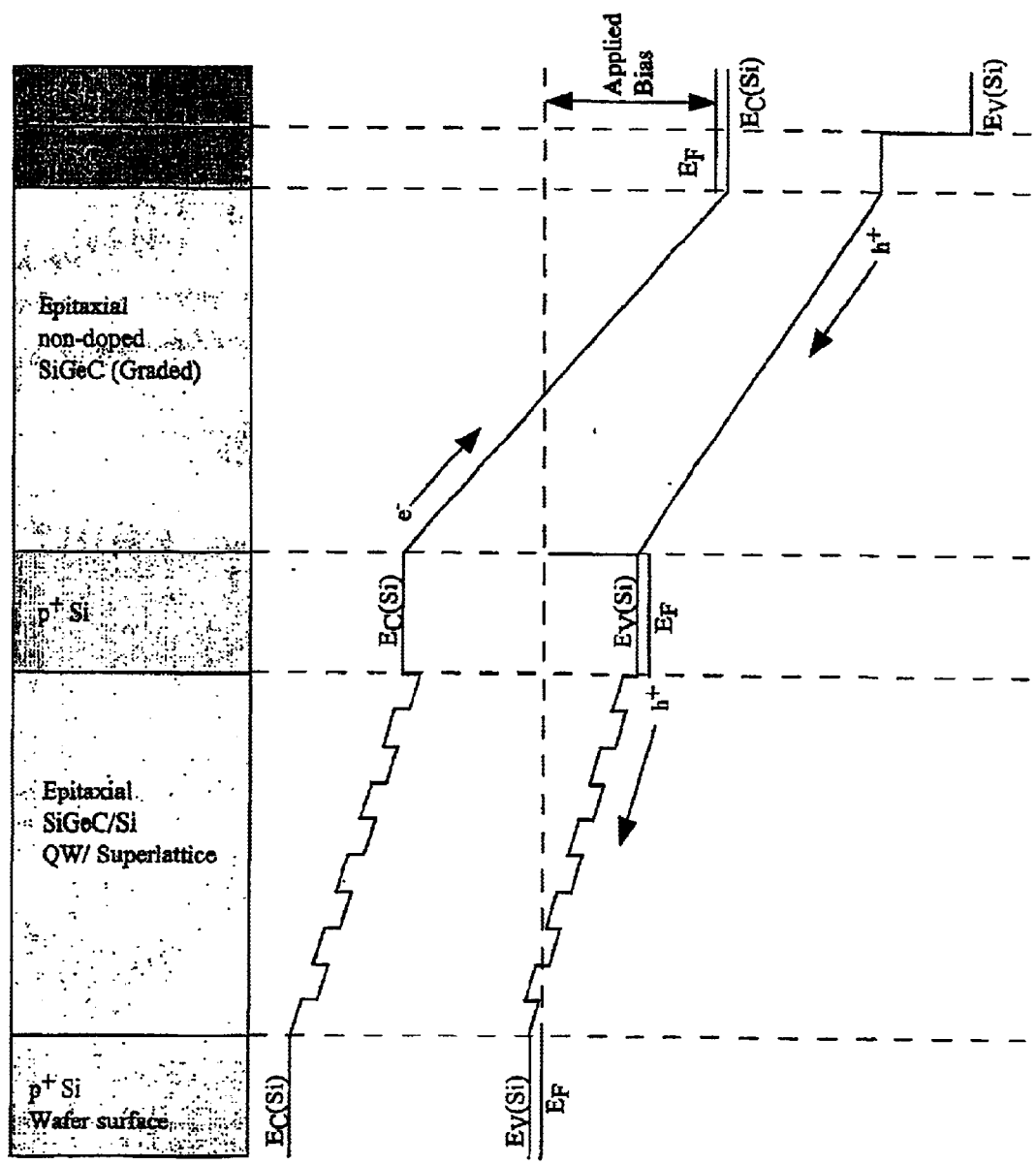

FIG. 10b shows a micro-cooler with p-type doped terminals, where the top electrode of the micro-cooler shares the same $p^+$ layer with the bottom electrode of the photodiode, whose top electrode is $n^+$-doped. The band-diagram depicts a situation where bias is applied between the top electrode of the photodiode and the bottom electrode of the micro-cooler (contacted through the "well contact").

In the arrangement shown in FIGS. 10a and 10b, no external contacts need to be made to any of the films in de middle of the epitaxial stack. This arrangement requires the photodiode bottom electrode and the micro-cooler top electrode to have the same type of doping. The main advantage of this scheme is that no contact is necessary to the middle of the epitaxial stack. However, it has two disadvantages: the photodiode and the micro-cooler cannot be biased independently from each other, and as the bias is applied across both devices in series, a large voltage might be needed that would require special voltage sources.

Figure 10C:
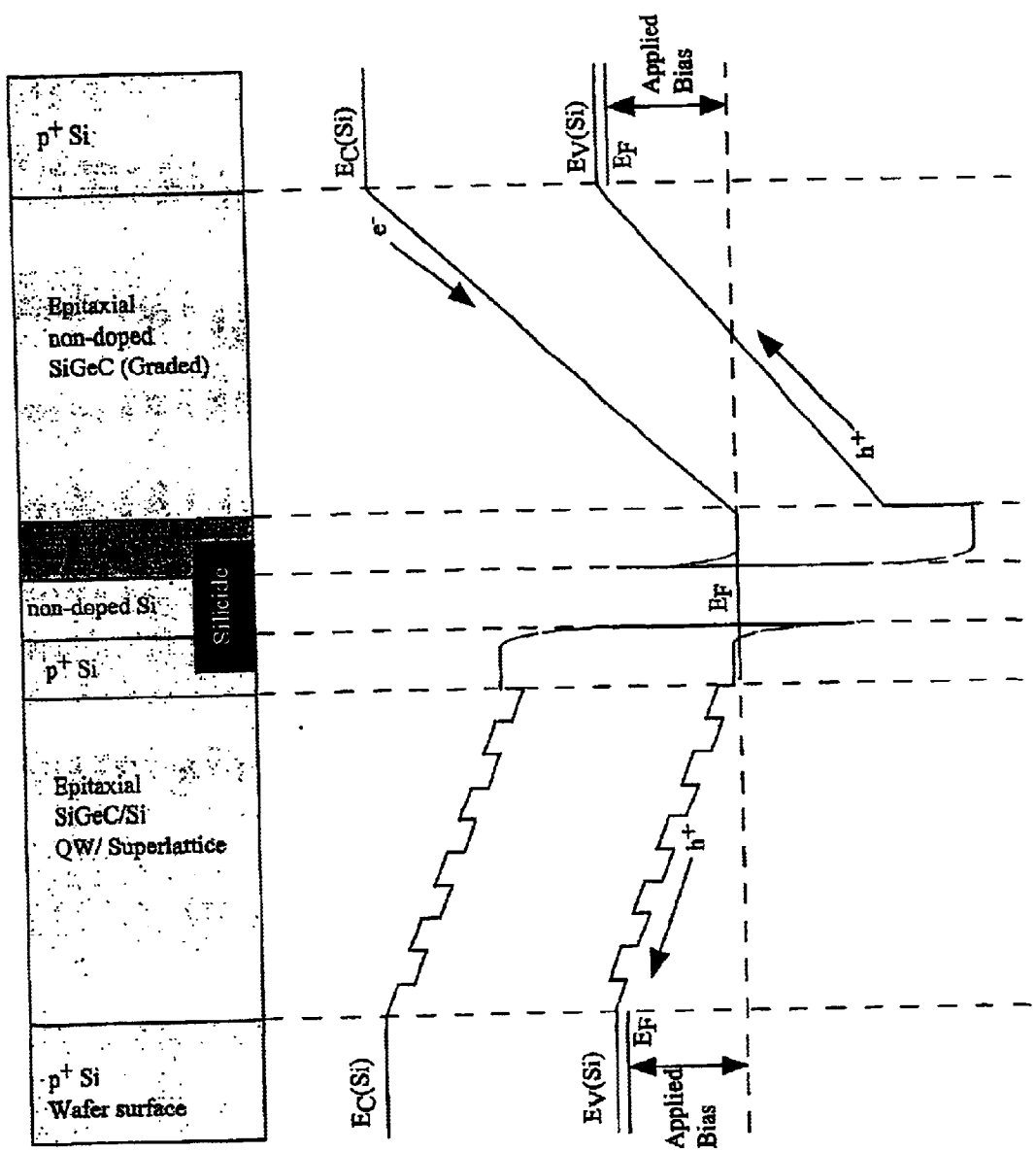

FIG. 10c shows a micro-cooler with p-type doped terminals, where the top electrode of the micro-cooler faces a $n^+$ doped bottom electrode of the photodiode, whose top electrode is $p^+$-doped. A common ohmic contact is achieved through the formation of a silicide. The band-diagram depicts a situation where the work-function of the silicide is positioned near the mid-gap of silicon, and with bias being applied between said silicide region and the top electrode for the photodiode, and applied between said silicide region and the bottom electrode (through "well contact") for the micro-cooler.

Figure 10D:
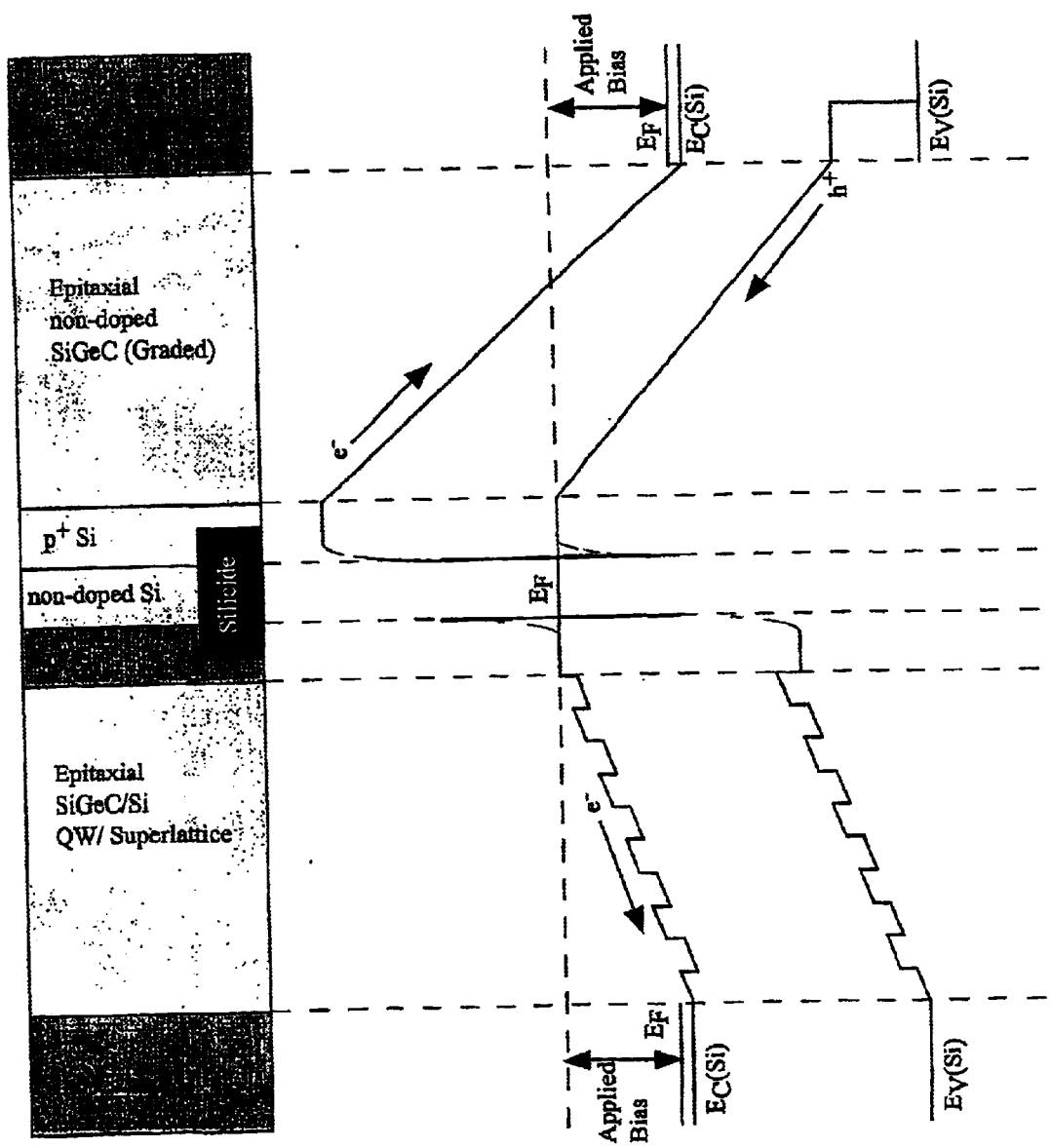

FIG. 10d shows a micro-cooler with n-type doped terminals, where the top electrode of the micro-cooler faces a $p^+$ doped bottom electrode of the photodiode, whose top electrode is $n^+$-doped. A common ohmic contact is achieved through the formation of a silicide. The band-diagram depicts a situation where the work-function of the silicide is positioned near the mid-gap of silicon, and with bias being applied between said silicide region and the top electrode for the photodiode, and applied between said silicide region and the bottom electrode (through "well contact") for the micro-cooler.

In the arrangement shown in FIGS. 10c and 10d, an external contact, schematically indicated as "Silicide", is made to the bottom electrode of the photodiode and to the top electrode of the micro-cooler, which are electrically connected. The main disadvantage of this scheme is that a contact has to be made to the middle of the epitaxial stack. This particular sequence of doping types, has the following two main advantages:
(a) The applied biases at the photodiode and at the micro-cooler are completely independent from each other;
(b) The middle contact can be the "ground", while voltages of the same polarity are applied to the other electrodes of the photodiode and micro-cooler;

At this point in time, it is perceived that options of FIGS. 10c and 10d are the best ones, for the following reasons:

(a) Lower voltage source (related to trends in CMOS technology)

(b) Device performance (independent optimization of band-gap and doping engineering), (c) Circuit design related to modes of operation of photodiode (e.g. high frequency AC bias for low noise operation).

Other reasons, described below, related to the process steps to make the contact to the middle of the epitaxial stack, determine that the preferred embodiment is the one shown in FIG. 10d. In addition to the reasons related to process technology, there is also the fact that in the arrangement of FIG. 10d, the micro-cooler is n-type doped and therefore is formed on $n^+$ active areas, which have the advantage in mobility over $p^+$ active areas.

Process steps specific for the contacts to these two devices have to be made before proceeding with the general contacts for all devices.

In order to make a contact to the middle electrodes the epitaxial layers above them have to be etched away. Given the small thickness of the films to be etched, and the requirement for damage-less etch of those films, it is likely that the solution lies with wet etch, at least in a first instance.

For the sake of process simplicity, it is convenient to make just one contact, to one film in the middle of the epitaxial stack, rather than several contacts to several different films in that same epitaxial stack. A single contact can be achieved by making the middle electrode common to the photodiode and to the micro-cooler. Therefore, the design of both devices and the epitaxial deposition process (exact sequence of alloy and doping profiles) need to reflect this approach.

Making a contact to some film in the middle of the epitaxial stack requires the removal of the films above it, which probably are very thin (e.g. <50 nm). In these circumstances, it is likely that the best technological solution is to use doping-sensitive, anisotropic wet etch (e.g. KOH or similar).

Considering these engineering factors, the optimum sequence of epitaxial layers is such that the photodiode's top electrode is n-type doped, and the bottom electrode is p-type doped. The micro-cooler's top and bottom electrodes are n-type doped.

With this sequence, the film of the photodiode bottom electrode can be used as etch stop for KOH (or equivalent anisotropic wet etchants). It is well known that KOH mixtures etch non-doped and n-typed doped silicon much faster than p-type doped silicon. In fact highly p-type doped silicon is regularly used as an etch stop for KOH and other mixtures. The fact the side walls will be not vertical but tapered is minimized or made irrelevant but the extreme thinness of the films to be etched away (~50 nm). The diameter of the contact holes to be etched is technology dependent, but even for CMOS generations beyond 0.1 μm, the aspect ratio of the hole will always be significantly less than one.

Figure 11A:
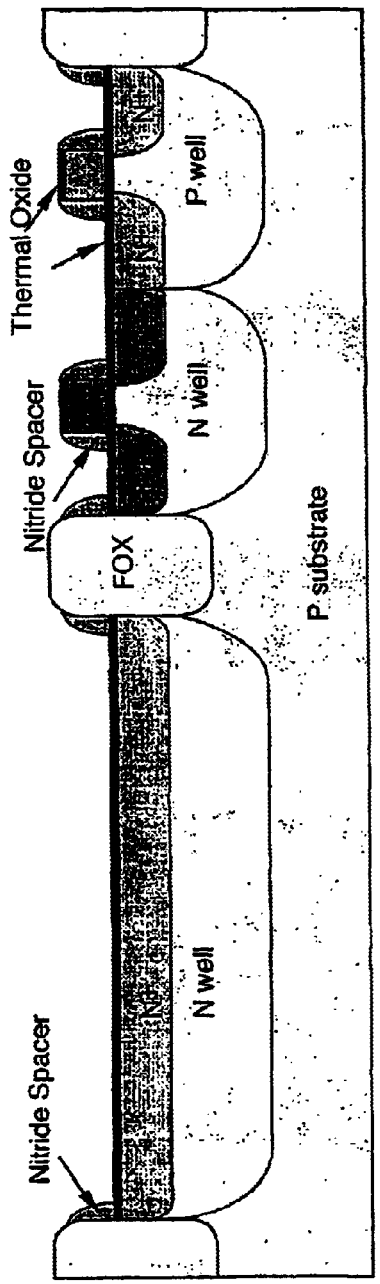

FIG. 11a shows a schematic cross-section of a silicon wafer substrate, after patterned etch back of silicon nitride a $Si_3N_4$ film. A double-well CMOS process is assumed. A triple-well could also be used, in which case the photodiode could be formed in a triple-well active area.

A patterned etch back of $Si_3N_4$ to form spacers is common practice in CMOS processing, as it is the preferred method of fabricating high resistivity circuit elements, by providing $Si_3N_4$ films on top of non-doped poly-Si lines, to prevent silicide formation on them.

On the left-hand side of the figure, photoresist covers the region where the photodiode films will be formed. The right-hand side of the figure shows $Si_3N_4$ spacers at the side walls of poly-Si gates, as well as the junctions and wells of PMOS and NMOS devices. Field Oxide (FOX) regions separate the active areas for the Photodiode film and for CMOS devices. As indicated in this figure, there is a thin Oxide ($SiO_2$) film covering the active areas, which was formed prior to the deposition & etch of the $Si_3N_4$ film. The exemplary process steps are detailed below.

"Micro-Cooler & Light Sensor Module"

Figure 11B:
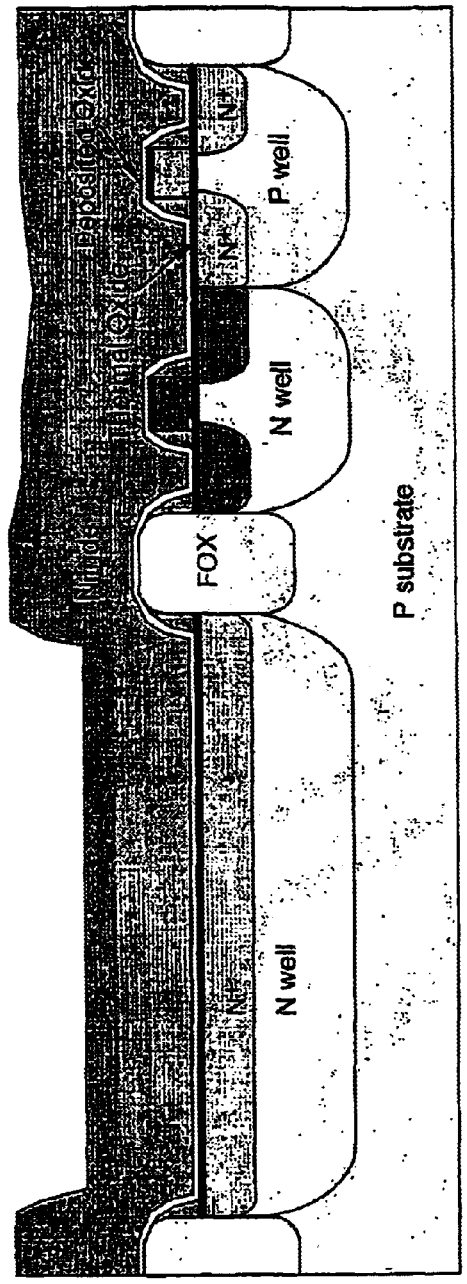

1) Deposition of thin (~5 nm) $SiO_2$ and low-stress thick (hundreds of nm) $Si_3N_4$ (FIG. 11b)

Figure 11C:
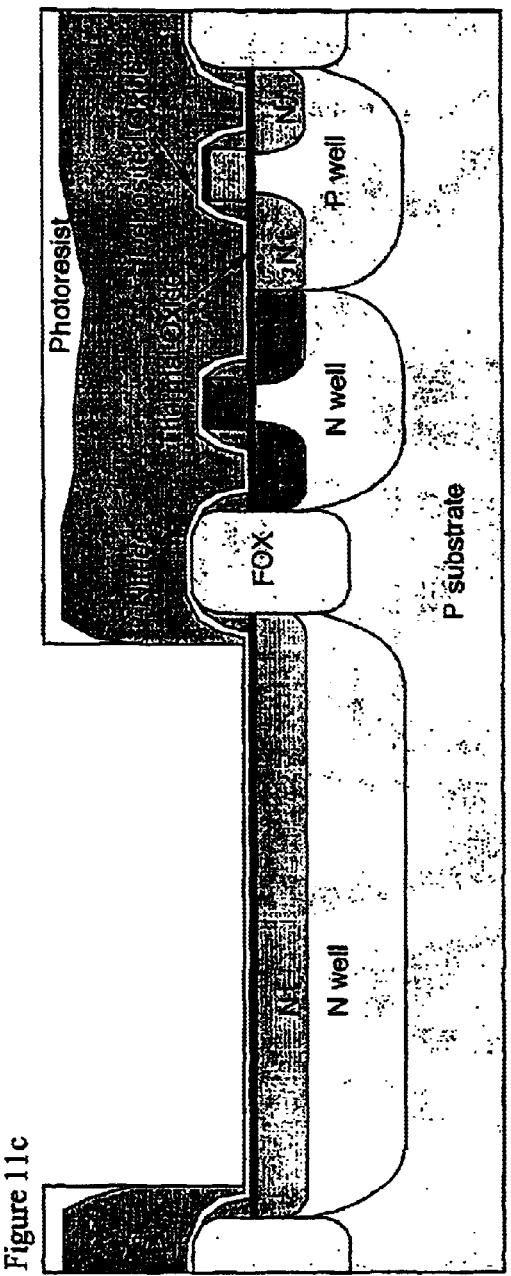

2) Photolithography: only the photodiode regions without photoresist;

3) Selective dry etch of $Si_3N_4$, stopping on thin oxide film (FIG. 11c)

Figure 11D:
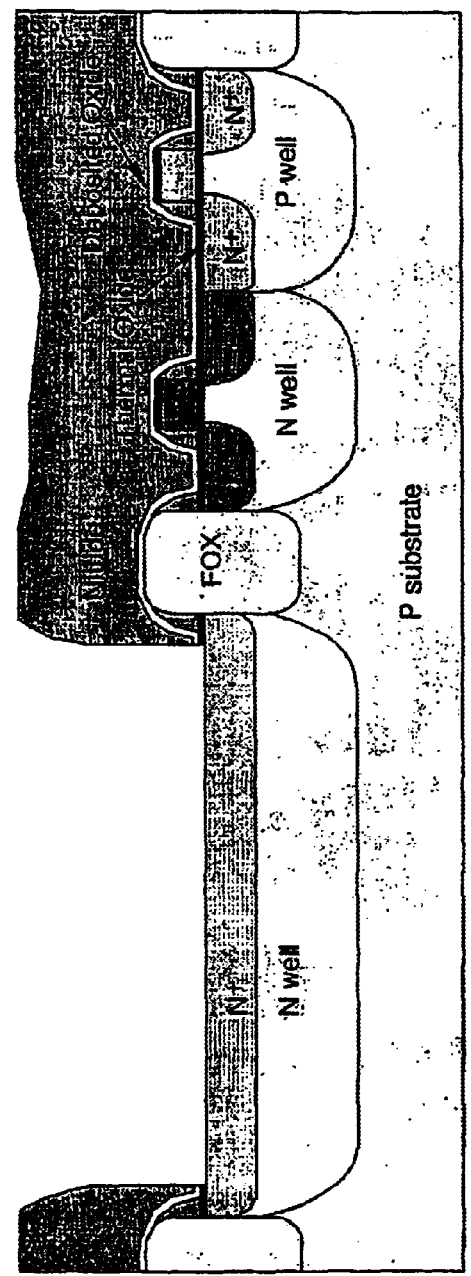

4) Photoresist strip and clean;

5) Removal of thin oxide from silicon surface, for example with Dilute-HF (FIG. 11d)

Figure 11E:
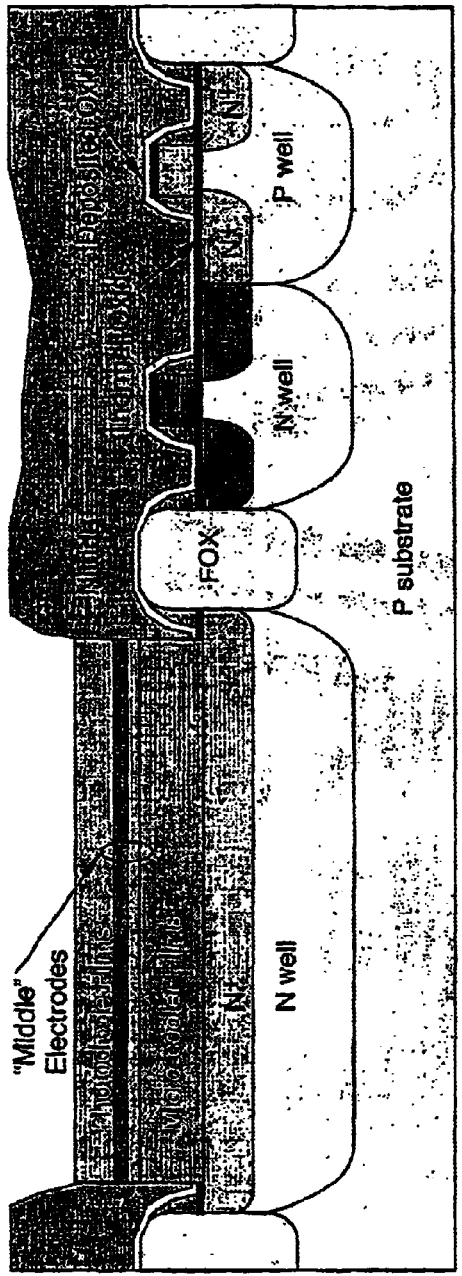

6) SEG of micro-cooler layers and photodiode layers (FIG. 11e)

"Contact to Middle Electrodes"

Figure 11F:
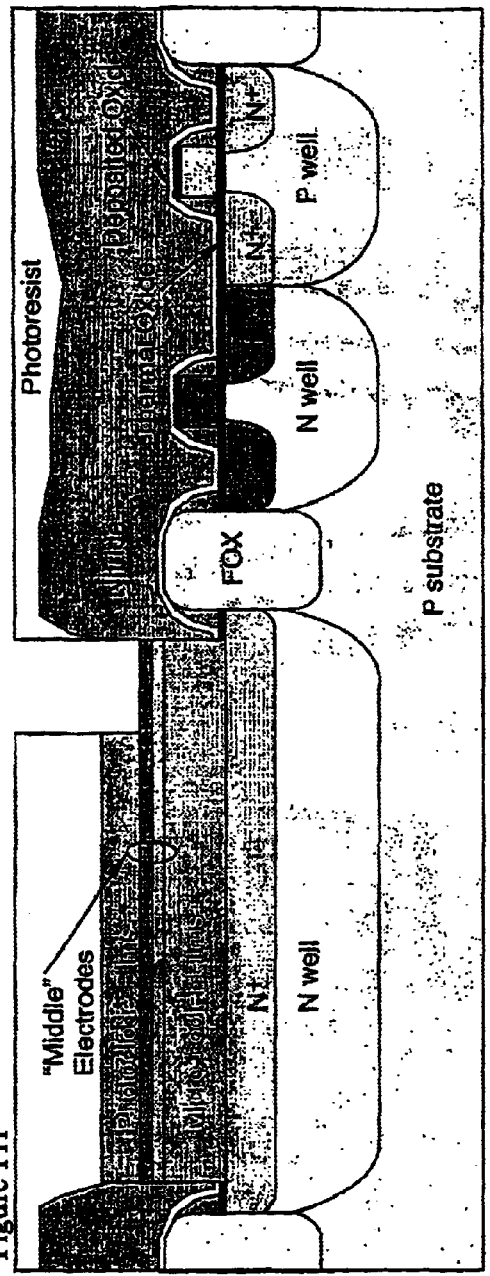

7) Photolithography: contact hole (oversized to include alignment tolerances);

8) Wet etch (e.g. KOH) of top photodiode layers (n-type and non-doped), stopping on the $p^+$ bottom electrode of photodiode (FIG. 11f)

9) Strip of photoresist;

10) Selective wet etch of nitride;

11) Full clean and removal of thin $SiO_2$ (deposited before the thick $Si_3N_4$ film) (FIG. 11g)

12) Deposition of thin (~5 nm) $SiO_2$ film (e.g. TEOS);

13) Deposition of thin (<10 nm) $Si_3N_4$ film (FIG. 11h)

Figure 11I:
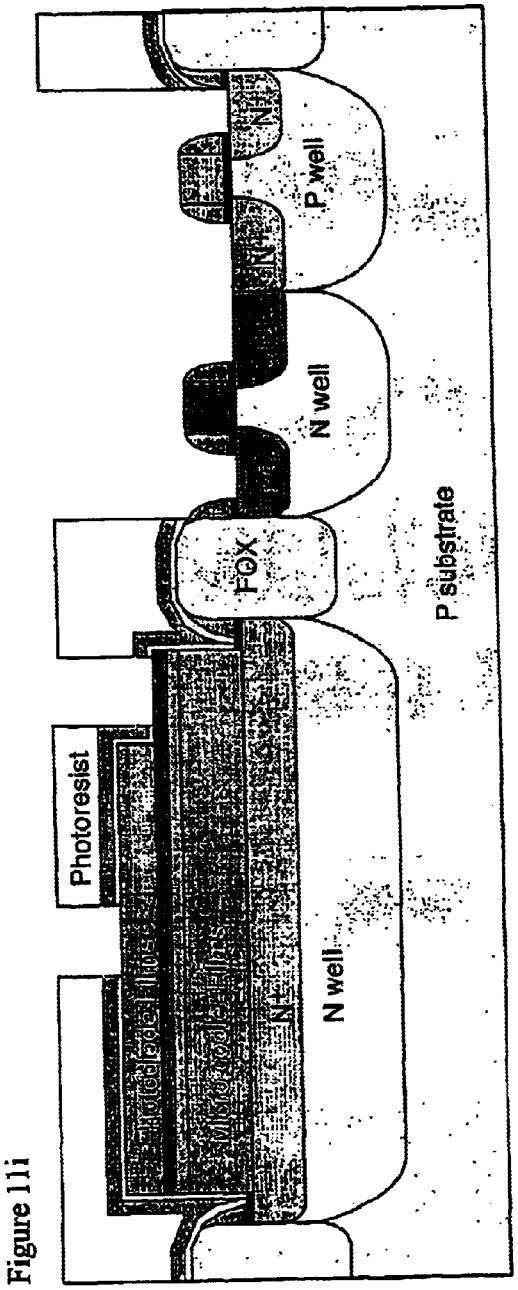
Figure 11J:
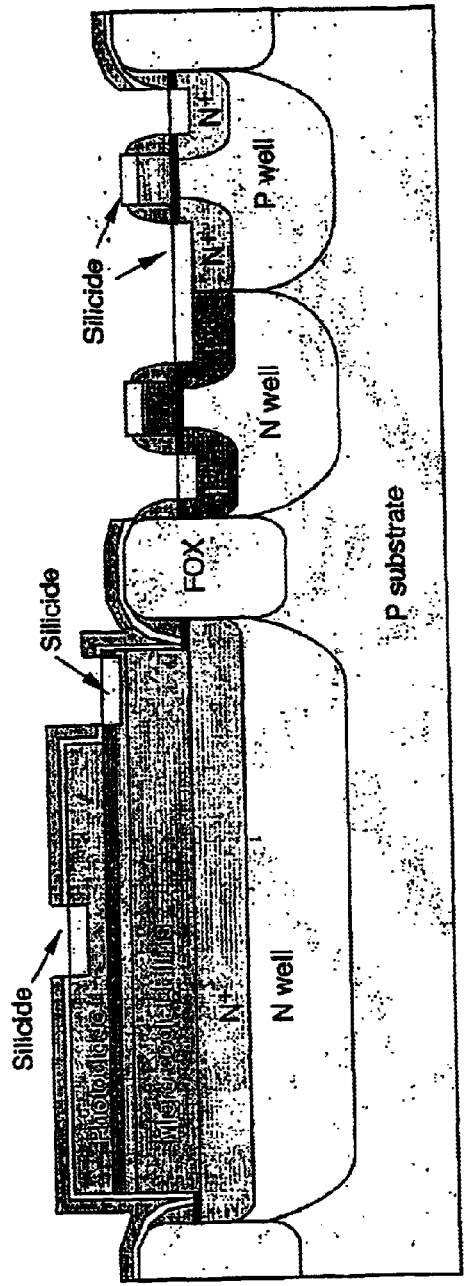

14) Photolithography: exposing (removal of photoresist) of all regions to where a silicide is to be formed;

15) Etch (dry or wet) of thin $Si_3N_4$, followed, by wet etch of thin $SiO_2$ film from silicon and poly-Si surfaces, e.g. with Dilute-HF (FIG. 11i)

"Silicide Module"

16) Strip of photoresist and clean;

17) Formation of silicide with conventional methods (FIG. 11j) It should be noticed that the formation of a silicide by conventional methods involves the reaction (consumption) of a portion of the substrate. Here that characteristic is taken advantage of, in the contact hole to the "middle layers", to make a simultaneous ohmic contact to the $p^+$ and the $n^+$ films.

Figure 11K:
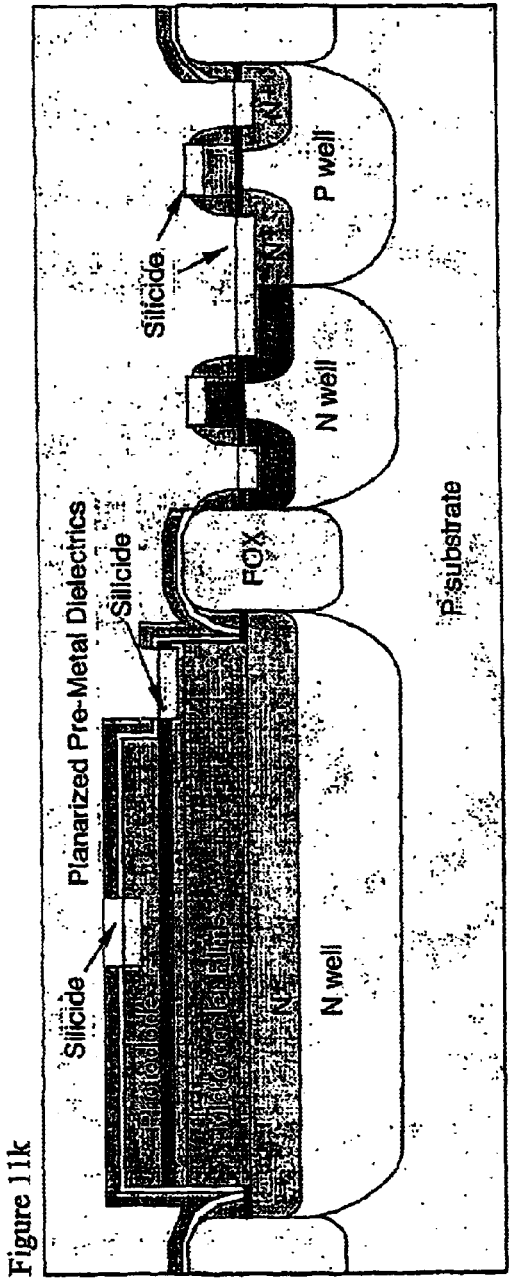

18) Deposition of Pre-Metal Dielectric layer(s);

19) Planarization (FIG. 11k)

"Standard Metallization"

Figure 11L:
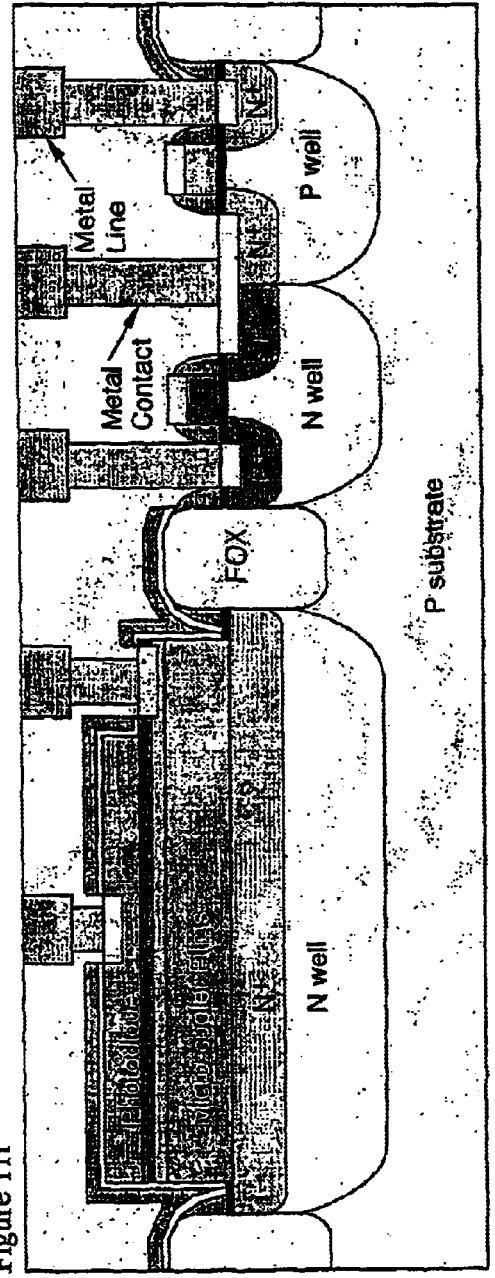

The existence of the photodiode and micro-cooler should not affect the processing for interconnects. FIG. 11l shows only the metal contacts and the first metal level.

What is claimed is:

1. A method of fabricating a photodiode module monolithically integrated with a CMOS structure in a semiconductor substrate, comprising the steps of:

(a) In said semiconductor substrate, forming at least one photo-diode active area surrounded by field oxide (FOX) regions, using any isolation technologies of CMOS processes, said photo-diode active area containing at least one embedded well semiconductor region implanted therein, said embedded well semiconductor region having a defined polarity, said embedded semiconductor well being surrounded laterally and underneath by semiconductor regions implanted with doping impurities of the opposite polarity, said embedded semiconductor well extending itself under a selected portion of the surrounding field oxide regions and overlapping at least a fraction of a selected adjacent active area, said overlapped fraction of adjacent active area including a surface region with high doping concentration of the same polarity of the embedded semiconductor well;

(b) epitaxially growing photosensitive layers on said at least one photo-diode active area, said photosensitive layers comprising at least a doped semiconductor material having the opposite polarity as that of the embedded well semiconductor region underneath;

(c) forming an ohmic contact region on at least one selected area of each of said epitaxially grown photosensitive layers;

(d) forming a columnar metal interconnect layer on top of each selected area of said epitaxially grown photosensitive layer; and (e) forming a planarized dielectric layer on the non-selected areas of said epitaxially grown photosensitive layers up to the top level of said metal interconnect layer.

2. The method as claimed in claim 1, wherein the epitaxial grow of photosensitive layers takes place in the CMOS process flow after formation of lightly doped drain (LDD) and source regions for CMOS devices, but before the highly doped drain (HDD) and source regions of CMOS devices are formed.

3. The method as claimed in claim 1, wherein the epitaxial grow of photosensitive layers takes place in the CMOS process flow after formation of highly doped drain (HDD) and source regions for CMOS devices, but before silicide is formed.

4. The method as claimed in claim 1, wherein said overlapped fraction of adjacent active area by the embedded well, is part of the source/drain region of a MOSFET.

5. The method as claimed in claim 1, wherein said overlapped fraction of adjacent active area, by the embedded well, includes surface region with same polarity of the semiconductor well, having a high doping concentration, suitable for the formation of an ohmic contact such as that provided by a silicide.

6. The method as claimed in claim 1, wherein said contact layer is an opaque conducting material.

7. The method as claimed in claim 1, wherein said contact layer is a light-transparent conducting material.

8. An image sensor fabricated according to the method of claim 1, wherein said at least one embedded well semiconductor region is isolated from at least one second embedded well semiconductor region, said at least one second embedded well semiconductor region forming part of a semiconductor charge storage device.

9. A heterojunction photodiode module monolithically integrated with a CMOS, fabricated according to the method of claim 1, wherein said photodiode comprises a stack of epitaxially deposited layers with pseudomorphic random alloys and/or superlattices and/or quantum well films of at least one material selected from the group comprising SiGe, SiGeC, GeC, SiSn, SiGeSn, SiCSn, SiGeCSn.

10. A heterojunction photodiode module monolithically integrated with a CMOS, fabricated according to the method of claim 1, wherein said photodiode comprises a stack of epitaxially deposited layers with pseudomorphic random alloys and/or superlattices and/or quantum well films of at least one material selected from the group comprising PbTe, PbSnSe, ZnS, GaN, AlN, $Al_2O_3$, $LaAl_2O_3$, $Pr_2O_3$, $CeO_2$, $CaF_2$, $Sr_2TiO_4$, $SrTiO_3$.

11. A CMOS image sensor incorporating at least one photodiode module fabricated according to the method of claim 1, with photodiode epitaxial layers according to claim 9.

12. A CMOS image sensor incorporating at least one photodiode module fabricated according to the method of claim 1 with photodiode epitaxial layers according to claim 10.

* * * * *